(12) United States Patent
Funamoto et al.

(10) Patent No.: US 7,501,754 B2
(45) Date of Patent: Mar. 10, 2009

(54) ORGANIC ELECTROLUMINESCENT DEVICE, METHOD OF MANUFACTURING ORGANIC ELECTROLUMINESCENT DEVICE, AND ELECTRONIC APPARATUS

(75) Inventors: Tatsuaki Funamoto, Fujimi-machi (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 402 days.

(21) Appl. No.: 11/056,270

(22) Filed: Feb. 14, 2005

(65) Prior Publication Data

US 2005/0285509 A1 Dec. 29, 2005

(30) Foreign Application Priority Data

Feb. 26, 2004 (JP) ............................. 2004-051663
Nov. 12, 2004 (JP) ............................. 2004-328591

(51) Int. Cl.
*H01J 1/62* (2006.01)
*H01J 63/04* (2006.01)

(52) U.S. Cl. .................. 313/504; 313/505; 313/506

(58) Field of Classification Search ......... 313/483–512, 313/504, 506
See application file for complete search history.

(56) References Cited

U.S. PATENT DOCUMENTS 6,559,594 B2 * 5/2003 Fukunaga et al. ........... 313/506

2003/0146692 A1 * 8/2003 Uchida ........................ 313/504
2003/0170493 A1 * 9/2003 Chen et al. .................. 428/690
2005/0023969 A1 * 2/2005 Omata et al. ................ 313/504

FOREIGN PATENT DOCUMENTS

| JP | A-2002-8868 | 1/2002 |
| JP | B2-3328297 | 7/2002 |
| JP | A-2003-272872 | 9/2003 |
| JP | A-2004-39567 | 2/2004 |

* cited by examiner

*Primary Examiner*—Nimeshkumar D. Patel
*Assistant Examiner*—Thomas A Hollweg
(74) *Attorney, Agent, or Firm*—Oliff & Berridge, PLC

(57) ABSTRACT

To provide an organic electroluminescent device and a method of manufacturing the same, in which the organic electroluminescent device has an organic functional layer formed by a liquid phase method, the organic functional layer formed in a uniform thickness while maintaining an aperture ratio, thereby obtaining a uniform and high efficient emission. According to an organic EL device of the present invention, an organic EL element having an organic functional layer interposed between a pixel electrode and a common electrode is arranged on a substrate, and the organic functional layer is arranged in a region surrounded by a bank arranged along the periphery of the pixel electrode, and at the same time, a hole injection layer and a light-emitting layer are stacked at the pixel electrode. A convex portion protruded at the hole injection layer is arranged on the pixel electrode and a part of the hole injection layer is interposed between the convex portion and the light-emitting layer.

8 Claims, 11 Drawing Sheets

ORGANIC ELECTROLUMINESCENT DEVICE, METHOD OF MANUFACTURING ORGANIC ELECTROLUMINESCENT DEVICE, AND ELECTRONIC APPARATUS

BACKGROUND

The present invention relates to an organic electroluminescent device, a method of manufacturing the organic electroluminescent device, and an electronic apparatus.

In recent years, an organic EL device using an organic EL (electroluminescent) element, which is a self-emission element, as a pixel has been proposed. The organic EL device has an organic functional layer, such as a light-emitting layer, interposed between an anode and a cathode, and recently, the organic EL device using a method of arranging liquid material containing resolved organic material in patterns on a substrate according to an inkjet method has been developed. For the organic EL device, it is possible to exactly form the organic functional layer on the substrate by providing a partition member partitioning each pixel on the substrate, and ejecting the liquid material into the region surrounded by the partition member.

For example, Patent Document 1 proposed that, by a liquid-repellent processing on a surface of the partition member having two-layered structure made of different material, liquid material is uniformly arranged on an electrode by the difference of affinity to the liquid material.

[Patent Document 1] Japanese Patent No. 3328297

[Patent Document 2] Japanese Unexamined Patent Application Publication No. 2003-272872

SUMMARY

According to the conventional art, it is possible to achieve a constant effect on uniform liquid material deposited on the electrode. However, according to the technique disclosed in Patent Document 1, the affinity to liquid material is performed using the member arranged around the electrode so that, when the amount of deposition of the liquid material on the flat area of the electrode, it may not have sufficient exposed spreading. In addition, according to the technique disclosed in Patent Document 2, when the region partitioned by the convex portion is fabricated to significantly small, a problem of the ink exposed spreading may not occur. However, with this, an aperture ratio of the pixel is degraded accordingly so that a sufficient display luminance cannot be achieved.

The present invention is devised to solve the above-mentioned problems, and an object of the present invention is to provide an organic electroluminescent device and a fabrication method thereof having an organic functional layer formed through a liquid phase method, in which the organic functional layer is formed uniformly in thickness while maintaining the aperture ratio, with a uniform and high luminance.

In order to achieve the above-mentioned objects, the present invention provides an organic electroluminescent device in which an organic EL element having an organic functional layer interposed between a first electrode and a second electrode, wherein the organic functional layer is arranged in a region surrounded by a partition member arranged along a periphery of the first electrode, and has a charge transport layer and a light-emitting layer formed on the first electrode, wherein a convex portion protruding toward the charge transport layer is arranged on the first electrode, and wherein a part of the charge transport layer is interposed between the convex portion and the light-emitting layer.

When the charge transport layer is formed through a liquid phase method, material for forming the charge transport layer and liquid material containing solvent are prepared to form the charge transport layer through dry solidification. Here, according to the present invention, a convex portion is arranged between the first electrode and the organic function layer, and the convex portion can prevent the liquid material from flowing on the pixels when dry solidifying the liquid material so that the solidification in the tilted state can be prevented. With this, the charge transport layer can be formed in a uniform layer thickness and quality. Therefore, a light-emitting layer formed on the charge transport layer is flattened so that a uniform emission can be obtained by using the organic functional layer having the uniform layer thickness and quality. In addition, with the uniform layer thickness, short-circuit between the electrodes is favorably prevented, so that an organic EL (electroluminescent) device having an excellent reliability can be obtained.

Further, the charge transport layer is also interposed between the convex portion and the light-emitting layer, so that the charge transport to the light-emitting layer is not blocked by arranging the convex portion and the light-emitting layer can emit all over the surface. In other words, even with the convex portion, the aperture ratio is not degraded.

Furthermore, the convex portion also has an effect of enhancing emission efficiency of the organic EL element. Light generated in the emission layer of the organic EL element makes an isotropic emission so that light emitted as a display light largely comes to be light emitted in the direction of thickness of the organic functional layer, so that a propagated light component in the plane direction of the organic functional layer does not substantially contribute to the display. Here, by arranging the convex portion protruded from the electrode plane as in the present invention, the propagation direction of the optical component propagating in the plane direction can be reflected or refracted at the convex portion. Therefore, it is possible to emit the corresponding optical component in the displayed light.

In the organic electroluminescent device of the present invention, the convex portion may be formed on the first electrode substantially in a stripe shape seen from the plane. With this construction, when the charge transport layer is formed using a liquid phase method, liquid material arranged in the region surrounded by the partition member can flow along the convex portion in a substantial stripe shape, so that it is possible to form the charge transport layer having a uniform thickness by filling liquid material uniformly into the above-mentioned region.

In the organic electroluminescent device of the present invention, the convex portion in a substantial stripe shape in plan view may extend along the longitudinal direction of the organic EL element. With this construction, it is possible to uniformly arrange liquid material in the longitudinal direction of the element in which liquid material is apt to be unevenly distributed. Therefore, the uniform layer thickness can be obtained.

In the organic electroluminescent device of the present invention, the convex portion may be made of a contour of dotted protrusions, and a plurality of convex portions may be formed on the first electrode. With this construction, liquid material can be favorably retained due to the convex portion, so that liquid material can be uniformly arranged on the first electrode and the thickness of the charge transport layer to be formed can be uniform.

In the organic electroluminescent device of the present invention, the protrusion of the convex portion may be arranged on the first electrode in a constant interval. With this construction, liquid material can be uniformly retained all over the surface of the first electrode, so that the thickness of the charge transport layer to be formed can be uniform.

In the organic electroluminescent device of the present invention, the protrusion of the convex portion may be arranged on the peripheral region on the first electrode in a high density. In other words, the protrusion may be arranged in a gap at a specific place (electrode peripheral unit). With this construction, liquid material arranged on the first electrode is formed in a semi-spherical shape (dome shape) due to a surface tension so that the uneven distribution thereof on the first electrode can be prevented.

In the organic electroluminescent device of the present invention, the protrusion of the convex portion may be arranged on the respective portion of the first electrode in a high density. With this construction, liquid material can be retained in the respective portions so that the charge transport layer can be formed in a uniform thickness all over the surface of the electrode.

In the organic electroluminescent device of the present invention, the protrusion of the convex portion may be arranged at the center of the region on the first electrode in a high density. With this construction, it is particularly effective when the region on the first electrode has an elongated plane shape. In fact, on the first electrode having the elongated shape, liquid material tends to be tilted to the end of the longitudinal direction, but by arranging the convex portion at the center on the first electrode in a high density, liquid material can be retained at the center of the region on the first electrode and the thickness of the charge transport layer to be formed can be uniform.

In the organic electroluminescent device of the present invention, the convex portion may have a tilting plane on the sidewall. With this construction, the thickness variation in the charge transport layer can be relieved and the degradation of the charge transport efficiency can be prevented, so that the uniform emission can be obtained. In addition, with the tilting plane, when the optical component in the plane direction of the organic functional layer of light generated from the emission layer is incident to the tilting plane, it is possible to easily emit the optical component in the thickness direction to contribute the light emission efficiency of the organic EL device.

In the organic electroluminescent device of the present invention, the convex portion may be made of the same material as that of at least a portion of the partition member. With this construction, the convex portion can be formed at the same time when forming the partition member. Therefore, without increasing the number of processing, the emission characteristic can be always improved.

In the organic electroluminescent device of the present invention, the partition member may comprise a first layer made of an inorganic insulating material, and a second layer made of an organic insulating material stacked thereon, and the convex portion may be made of the same material as that of the first layer. With this construction, the convex portion can be formed at the same time when forming the first layer so that the effective fabrication is available. In addition to that, with the convex portion made of an inorganic insulating material, it is easy to enhance the affinity of liquid material compared with the second layer made of an organic insulating material. Therefore, liquid material can have a favorable exposed spreading on the first electrode and the uniformity of the charge transport layer can be further improved.

In the organic electroluminescent device of the present invention, the convex portion may occupy a part of the first electrode. In other words, the convex portion may be formed through a process of the surface of the first electrode.

In the organic electroluminescent device of the present invention, the charge transport layer may be one or a plurality of conductive layers, and the convex portion may be arranged across the respective conductive layers in the thickness direction of the layer. In other words, even when the charge transport layer has a plurality of stacked layers, at least a portion of the uppermost layer (outermost emission layer side) of the conductive layer may be interposed between the emission layer and the charge transport layer.

Next, the present invention provides a method of manufacturing an organic electroluminescent device in which organic EL elements each having a first electrode, an organic function layer having a transport layer and a light-emitting layer, and a second electrode formed in this order are arranged on a substrate, comprising: a step of forming a first electrode on the substrate; a step of forming a convex portion on the first electrode; a step of arranging a partition member along a periphery of the first electrode; a step of providing liquid material containing charge transport material in a region surrounded by the partition member; and a step of forming a charge transport layer that covers the convex portion by drying the liquid material.

With this fabrication method, by forming the convex portion on the first electrode, liquid material is deposited on the electrode on which the convex portion is arranged. Therefore, while drying liquid material, the uneven uniformity of liquid material can be prevented due to the convex portion so that the charge transport layer can be formed in the uniform thickness. Moreover, since the light-emitting layer is flattened, the organic EL device having a favorable emission characteristic can be fabricated. In addition, since the charge transport layer is formed with the convex portion covered, the organic EL device having a high aperture ratio can be fabricated without degrading the charge transportation.

In the method of manufacturing the organic electroluminescent device of the present invention, the step of forming the convex portion and the step of arranging the partition member may be performed during the same process.

Furthermore, in the method of manufacturing the organic electroluminescent device of the present invention, the step of arranging the partition member may comprise a step of forming a first layer made of an inorganic insulating material on the substrate, and a forming a second layer made of an organic insulating material, and in the step of forming the first layer, the convex portion may be made of the inorganic insulating material.

With this fabrication method, since the step of forming the partition member can be formed at the same time when forming the convex portion, an addition step of forming the convex portion is not necessary, so that the fabrication can be effectively performed. In addition, processing using the conventional process is facilitated.

In the method of manufacturing the organic electroluminescent device of the present invention, before arranging the liquid material, the surface affinity of the convex portion for the liquid material may be set to be higher than the surface affinity of the first electrode for the liquid material. With this method, when liquid material is deposited on the first electrode having the convex portion thereon, liquid material can be spread due to the convex portion and the uniformity of the charge transport layer to be formed can be accomplished.

In the method of manufacturing the organic electroluminescent device of the present invention, the step of forming the convex portion may be a step of partially removing a surface of the first electrode. In other words, the first electrode may be formed to have the convex portion. In this case, the thickness of the charge transport layer can be uniform due to the convex portion and the organic EL device having a favorable emission characteristic can be obtained.

Next, an electronic apparatus of the present invention may comprise an organic electroluminescent device of the present invention described above. With this construction, the electronic apparatus having a display unit with which a high brightness, high contrast and a high quality display can be made is provided with the organic EL device of the present invention.

DETAILED DESCRIPTION OF EMBODIMENTS (Organic EL Device)

Hereinafter, exemplary embodiments according to the present invention will be described with reference to the accompanying drawings. In the following embodiments, the organic EL element will be described by exemplifying an organic EL device (organic electroluminescent device) arranged on a substrate as a pixel. This organic EL device can be appropriately used as display means of an electronic apparatus, for example.

First Embodiment

Figure 1:
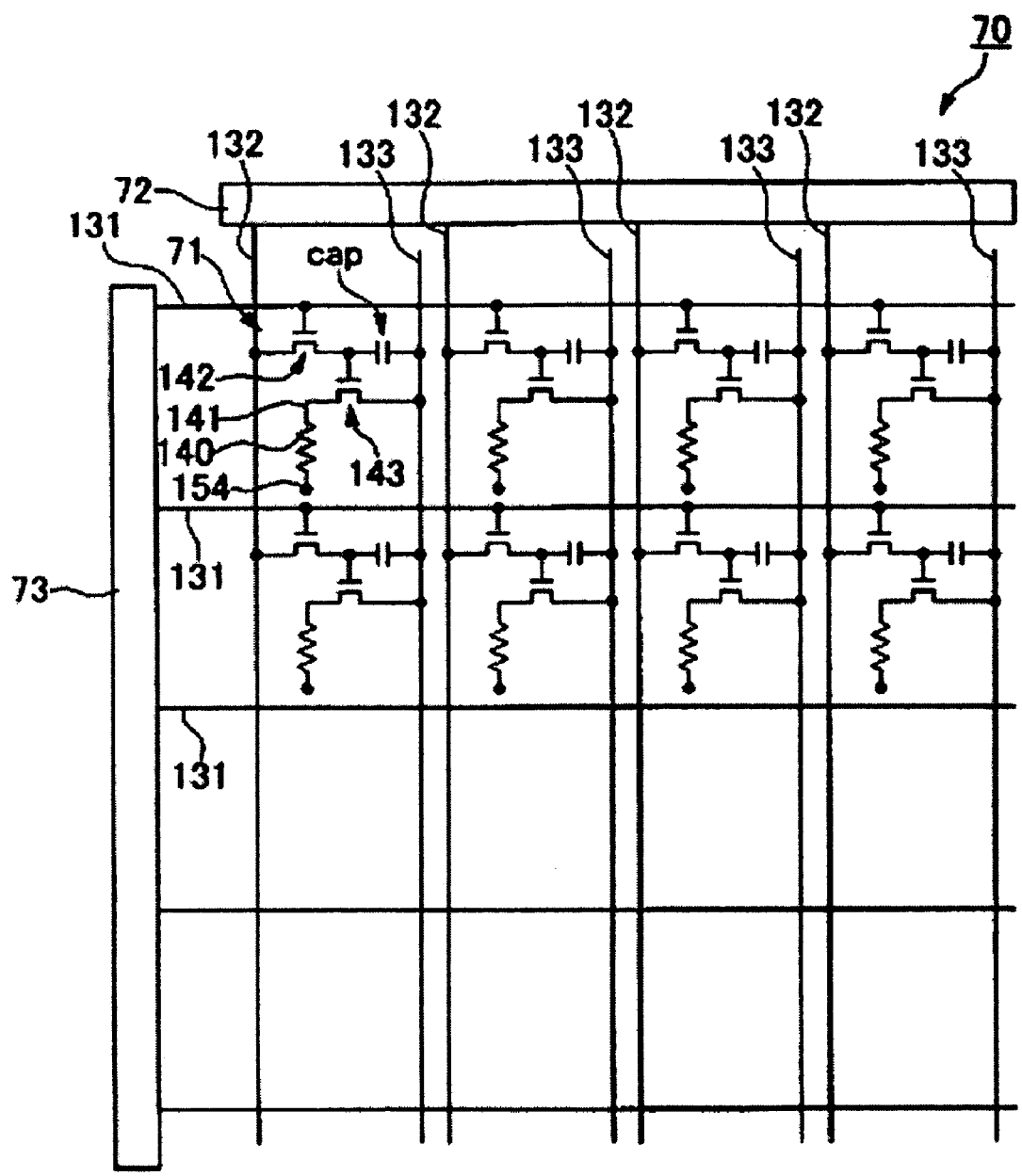
FIG. 1 is a circuit diagram of an organic EL device according to the first embodiment of the present invention.
Figure 2A:
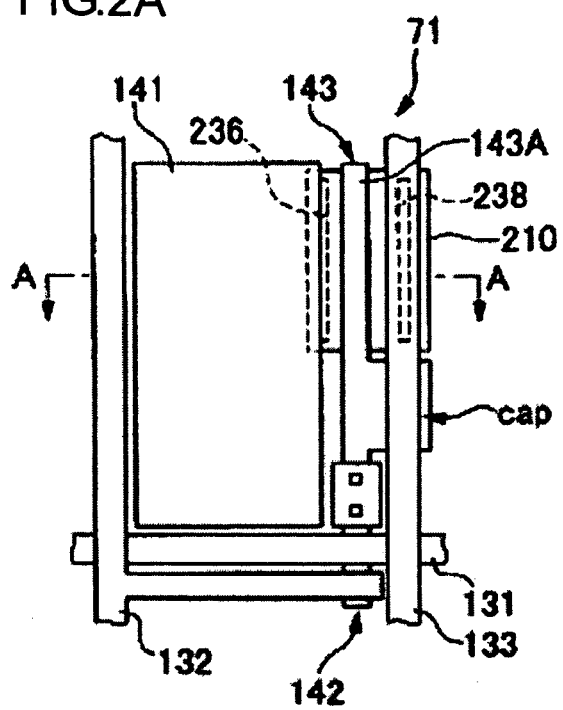
FIGS. 2A and 2B are plan views of the organic EL device of FIG. 1.
Figure 2B:
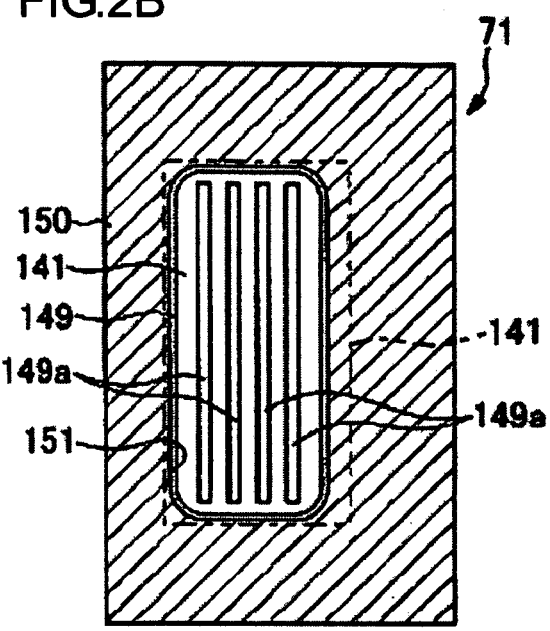
Figures 3A, 3B:
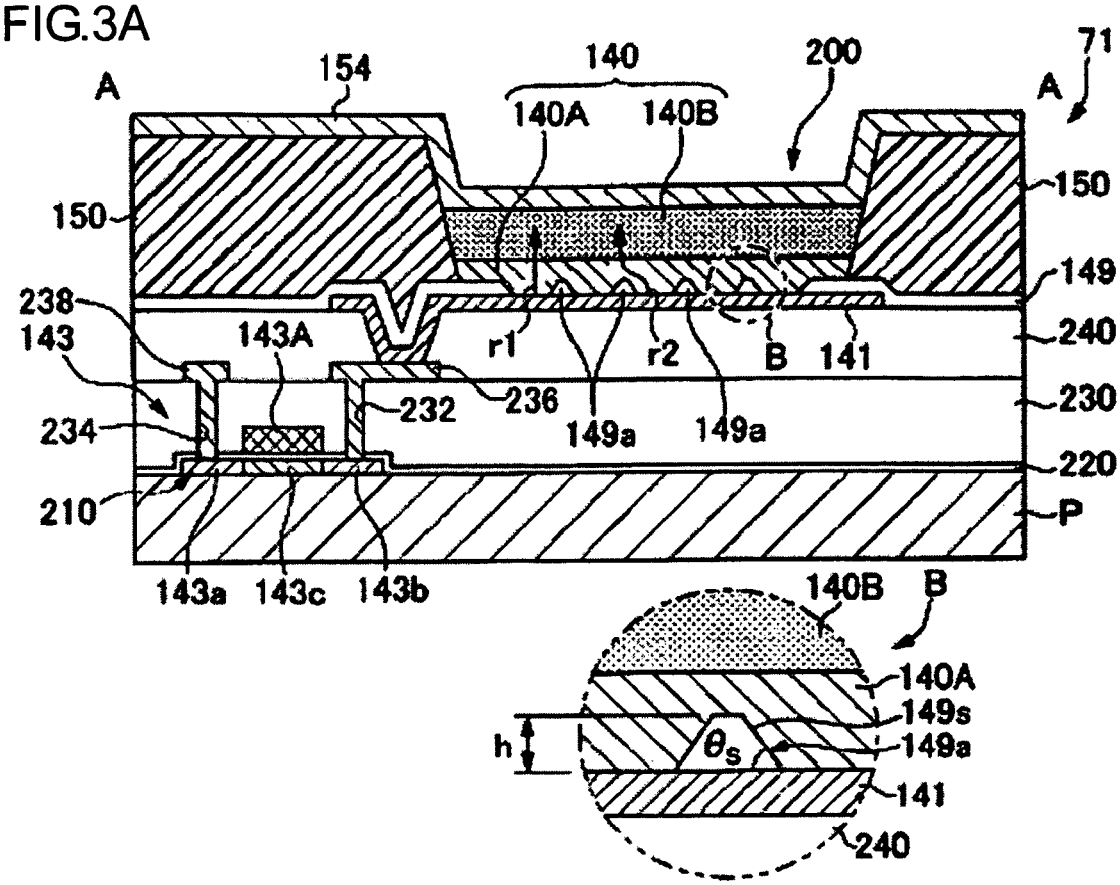
FIGS. 3A and 3B are cross sectional views taken along a line A-A of FIG. 2.

FIG. 1 is a circuit configuration diagram of an organic EL device according to a first embodiment of the present invention, and FIG. 2 is a diagram showing a plane structure of each pixel 71 which the organic EL device includes, where FIG. 2(a) is a diagram mainly showing a pixel driving portion of the TFT and the like of the pixel 71, and FIG. 2(b) is a diagram showing a bank (partition member) for partitioning the pixels. In addition, FIG. 3(a) is a cross-sectional view taken along the line A-A of FIG. 2(a), and FIG. 3(b) is an enlarged diagram of a region B shown in FIG. 3(a).

As shown in FIG. 1, the organic EL device 70 comprises a plurality of scanning lines (wiring lines and power transmission unit) 131, a plurality of signal lines (wiring, power transmission line) 132 extending along a direction crossing the scanning lines 131, and a plurality of common power supply lines (wiring, power transmission line) 133 extending parallel to the signal lines 132, respectively on a transparent substrate, in which pixels (pixel regions) 71 are arranged at the intersections of the scanning lines 131 and the signal lines 132.

A data line driving circuit 72 including a shift register, a level shifter, a video line, and an analog switch is arranged on the signal lines 132. Further, a scanning line driving circuit 73 including a shift register and a level shifter and the like is arranged on the scanning lines 131. In addition, for each of the pixel regions 71, there are provided a switching thin film transistor (TFT) 142 for supplying the scanning signal to the gate electrode through the scanning line 131; a storage capacitor cap for storing an image signal (power) supplied from the signal line 132 through the switching thin film transistor (TFT) 142; a driving TFT 143 in which the image signal stored by the storage capacitor cap is supplied to the gate electrode; a pixel electrode 141 into which a driving current flows from the common supply line 133 when electrically connected to the common supply line 133 through the driving TFT 143; and a light-emitting unit 140 interposed between the pixel electrode 141 and the common electrode 154. In addition, the organic EL element according to the present invention comprises the pixel electrode 141, the common electrode 154, and the light-emitting unit 140.

With the above-mentioned construction, when the scanning 131 is driven to turn on the switching TFT 142, the electric potential of the signal line 132 at that time is stored into the storage capacitor cap, so that the driving TFT 143 is turned off/on according to the storage capacitor cap. In addition, a current flows from the common supply line 133 to the pixel electrode 141 through a channel of the driving TFT 143, so that a current flows to the common electrode 154 through the light-emitting unit 140. Thus, the light-emitting unit 140 emits light according to the amount of the current.

Next, for a plane structure of the pixel 71 shown in FIG. 2(a), four sides of the pixel electrode 141 having a substantially rectangular shape in plan view are surrounded by the signal line 132, the common supply line 133, the scanning line 131, and the scanning line for the other pixel electrode, which is not shown. In addition, for a cross-sectional structure of the pixel 71 shown in FIG. 3(a), the driving TFT 143 is arranged on a substrate (base) P, and the organic EL element 200 is formed on the substrate P with a plurality of insulating films formed by covering the driving TFT 143 interposed therebetween. The organic EL element 200 is mainly composed of an organic functional layer 140 provided in a region surrounded by banks (partition members) 150 arranged on the substrate P, and has the organic functional layer interposed between the pixel electrode 141 and the common electrode 154.

Here, from the plane structure shown in FIG. 2(b), each bank 150 has an opening 151 which corresponds to the formation region of the pixel electrode 141 and having a substantially rectangular shape in a plan view, and the above-mentioned organic functional layer 140 is previously formed in the opening 151. In addition, as shown in FIGS. 2(b) and 3(a), a plurality of (four) convex portions 149a are arranged on the surface of the pixel electrode 141 in a stripe shape in a plan view.

In addition, as shown in FIG. 3(a), the driving TFT 143 is largely composed of a gate electrode 143A facing a channel region 143c via a gate insulating film 220 formed on a semiconductor layer, a source region 143a, a drain region 143b, and a channel region 143c formed on the semiconductor film 210. A first interlayer insulating film 230 covering the semiconductor film 210 and the gate insulating film 220 is formed, and a drain electrode 236 and a source electrode 238 are buried in contact holes 232 and 234 which reach to a semiconductor film 210 by passing through the first interlayer dielectric layer 230, and the respective electrodes are electrically connected to the drain region 143b and the source region 143a. A second planarization insulating film 240 is formed on the first interlayer insulating film 230, and a part of the pixel electrode 141 is buried in the contact hole arranged into the second planarization insulating film 240. In addition, the drain electrode 236 is electrically connected to the pixel electrode 141, and the driving TFT 143 and the pixel electrode 141 (organic EL element 200) are electrically connected to each other. An inorganic bank (first layer) 149 made of an inorganic insulating material is formed on a part of the circumference portion of the pixel electrode 141 so as to be mounted on it, and the convex portions 149a made of the same material are formed on the same layer as the inorganic bank 149 so as to protrude toward the organic functional layer 140. The bank (second layer) 150 made of an organic material is deposited on the inorganic bank 149 to form the partition member in the organic EL device.

In the organic EL element 200, a hole injection layer (charge transport layer) 140A and a light-emitting layer 140B are deposited on the pixel electrode 141 to form the common electrode 154 that covers the light-emitting layer 140B and the bank 150. The hole injection layer 140A is formed to cover the convex portions 149a arranged on the pixel electrode 141, and its circumferential ends is formed to cover the part protruding toward the center of the pixel electrode 141 from the bank 150 out of the inorganic bank 149 arranged below the bank 150.

As the substrate P, in the case of a so-called top emission type organic EL device, light emits at the side where the organic EL element 200 is arranged, so that an opaque substrate as well as a transparent substrate such as a glass can be used. As the opaque substrate, there can be used ceramics such as alumina, insulating metal steels, such as surface oxidized stainless steel, a thermosetting resin or thermoplastic resin, and a film thereof (plastic film).

In the case of a bottom emission type organic EL device where light emits through the substrate P, the pixel electrode 141 is formed of a transparent conductive material such as ITO (indium tin oxide). However, in the case of a top emission type organic EL device, the pixel electrode 141 needs not be the transparent material, but an appropriate conductive material such as metal material can be used.

The common electrode 154 is formed on the substrate P such that it covers surfaces of the light-emitting layer 140B and, the top and sidewall of the bank 150. A transparent conductive material is used as a material for forming the common electrode 154 in the case of the top emission type organic EL device. As the transparent conductive material, ITO is very suitable but other light emission type conductive material can also be used.

A cathode protection layer can be formed on the upper layer of the common electrode 154. With the cathode protection layer, at the time of a manufacturing process, the common electrode 154 can be prevented from corroding and can be made of an inorganic compound, e.g., silicon compound such as silicon oxides, silicon nitrides, and silicon oxynitrides. By covering the common electrode 154 with the cathode protection layer made of the inorganic compound, oxygen intrusion into the common electrode 154 made of the inorganic oxide can be favorably prevented. In addition, the cathode protection layer is formed on the outer substrate of the plane region of the common electrode 154 with a thickness of from about 10 nm to 300 nm.

In the organic EL device having the above structure of the present embodiment, while the convex portions 149a are arranged to partition a surface region of the pixel electrode 141 in a planar, the hole injection layer 140A is formed thereon so as to cover them. Therefore, as shown in FIG. 3(a), in a region where the convex portion 149a does not exist, the hole injected from the pixel electrode 141 serving as an anode moves straight into the hole injection layer 140A in the thickness direction as indicated by a path r1 to reach the light-emitting layer 140B. In addition, in a region where the convex portion 149a is arranged, the hole injected from the other region moves around the convex portion 149a as indicated by a path r2 to reach the light-emitting layer 140B. In other words, even though a part of the pixel electrode 141 is covered with the convex portions 149 made of an inorganic insulating material, charge transport at the interface between the light-emitting layer 140B and the hole injection layer 140A can be ensured, so that uniform emission can be obtained over the entire surface of the light-emitting layer 140B containing the formation regions of the convex portions 149a.

In addition, as enlarged in FIG. 3(b), the convex portion 149a is formed in a substantially trapezoid shape as seen from the cross section having a tilting unit 149s formed at the sidewall. With the convex portion 149a having the tilting unit 149s, a thickness difference within the hole injection layer 140A can be relieved so that the organic EL element 200 can be stably operated. In addition, the hole moving inside the hole injection layer 140A easily moves around the convex portion 149a, thereby attributing an enhancement of emission efficiency.

In addition, a height h of the protrusion of the convex portion 149a is preferably 50 nm or less, and more preferably 10 nm to 50 nm. With the low protrusion height h, the step difference on the pixel electrode 141 decreases so that the uniformity in thickness of the hole injection layer 140A is easily obtained and the hole supplied from the pixel electrode can easily moves around upon operation. When the protrusion height h is in a range of 10 nm to 50 nm, the emission efficiency increases and becomes stable so that the hole injection layer 140A having the uniform thickness can be formed. Further, when the protrusion height is above 50 nm, the thickness difference in the hole injection layer 140A increases so that emission unevenness in the plane region of the organic EL element may occur.

In addition, while the detailed description on the method of manufacturing the back end will be described below, when the hole injection layer 140A is formed through a liquid phase method, the convex portions 149a serves to make the thickness and quality of layer uniform. Thus, the hole injection layer 140A as well as the light-emitting layer 140B is flattened. Accordingly, the short-circuit between the electrodes and the unevenness of the luminance brightness due to the non-uniformity of the thickness and quality of layer are hardly occur, so that high-quality display light can be obtained. In addition, in the case in which the convex portion 149a has the tilting plane 149s shown in FIG. 3(b), when the hole injection layer 140A is formed using the liquid phase method, the defect in forming the hole injection layer 140A is hardly generated so that the hole injection layer having the uniform film thickness and quality can be easily formed.

Therefore, according to the organic EL device of the present embodiment, the high image quality display with high luminance and high contrast can be achieved with the organic EL element 200 that emits bright light with high efficiency.

Figure 12:
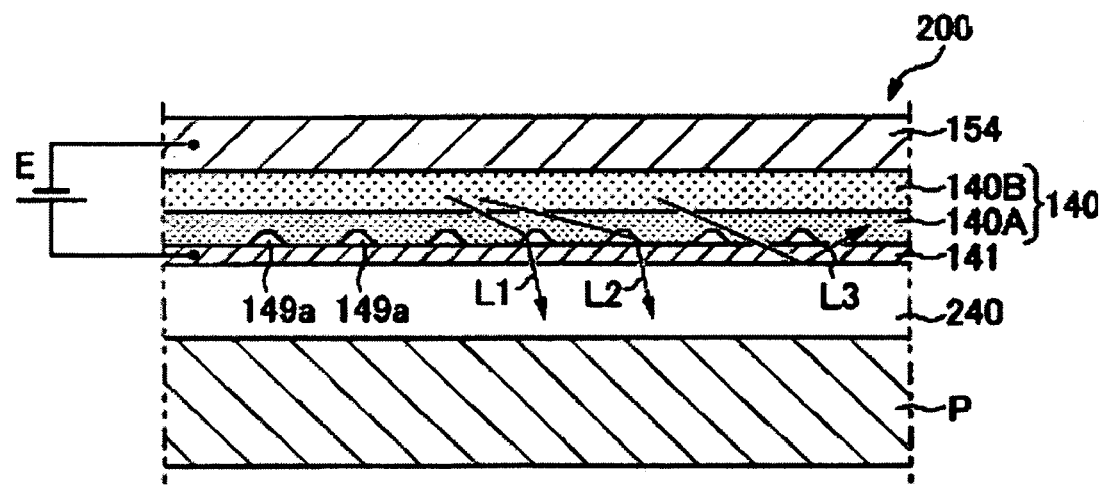
FIG. 12 is a cross sectional view of an organic EL element according to the first embodiment of the present invention.

Furthermore, the convex portions 149a also serve to enhance emission efficiency of the organic EL element 200. FIG. 12 is a partial cross-sectional view of an organic EL element 200 for explaining operation related to the convex portion 149a. When a voltage from a power supply E is applied between the common electrode 154 and the pixel electrode 141 constituting the organic EL element 200, electrons and holes are recombined in the light-emitting layer 140B to emit light, but this light isotropically scatters from the light-emitting position. For this reason, a component in the direction of an element thickness (up and down direction) may easily be emitted as a display light, but a component in the direction of an element plane (left and right direction) is confined in the organic EL element 200 since it is total reflected at the interface between the pixel electrode 141 made of the ITO and the planarization insulating film 240 made of a transparent resin or an oxide silicon in the case of a bottom emission type organic EL device (optical path L3). With respect to this, when the convex portions 149a are arranged on the pixel electrode 141 as in the present embodiment, the optical component incident to the convex portions 149a after being total reflected in the direction of the element plane is refracted to the pixel electrode 141 due to the difference of a refractive index of the hole injection layer 140A to the convex portion 149a to emit light toward the substrate P (optical paths L1 and L2). With this, the emission efficiency of the organic EL element 200 can be enhanced to display a bright light. Moreover, when the hole injection layer 140A is made of compound of polyethylenedioxythiophene and polystyrenesulfonate (PEDOT/PSS), the refractive index thereof is about 1.8 and the refractive index of the pixel electrode 141 made of ITO is about 2.1 to 2.2. In addition, when the convex portion 149a is made of silicon oxide ($SiO_2$), the refractive index thereof is about 1.4.

Although the emission efficiency can be improved without the cross-sectional shape of the convex portion 149a, when the convex portion 149a has a tilting plane 149s thereon shown in FIG. 3(b), a propagating-direction perpendicular to the substrate P can be changed by refraction at the outer surface of the tilting plane 149s (optical path L1) or by reflection at the inner surface (optical path L2) as shown in FIG. 12, so that the emission efficiency can be further improved. A tilting angle θs of the tilting plane 149s of the convex portion shown in FIG. 3(b) is preferably in a range of 30° to 60°. When the tilting angle θs is less than 30°, the emission efficiency is not sufficiently enhanced. When the tilting angle is above 60°, the short-circuit between the pixel electrode 141 and the common electrode 154 or the variation of the luminance brightness due to the unevenness of the film thickness or film quality of the hole injection layer may easily occur.

In addition, although the bottom emission type organic EL device has been described, emission efficiency can also be enhanced with the top emission type organic EL device. For the top emission type organic EL device, the pixel electrode 141 is made of a conductive film reflective to light, such as aluminum or silver, and the convex portions 149 are formed thereon. However, even with this construction, when light propagating in the direction of the plane of the organic EL element is incident to the convex portions 149a, the propagation direction can be changed so that display light can be easily emitted.

In addition, although the present embodiment has been described about the case in which the convex portions 149a are substantially as high as the inorganic bank 149, the height of the convex portions 149a is not limited hereto but can be adjusted appropriately. In other words, since the part of the hole injection layer 140A is interposed between the light-emitting layer 140B and the convex portions 149a, when the hole injection layer 140A is formed thin, the convex portion 149a can be formed thin accordingly. Although the convex portions 149a are made of the same material as that of the inorganic bank 149, e.g., made of silicon oxide, the convex portion 149a and the inorganic bank 149 may be made of a different material, and metal oxide such as titanium oxide, for example. Alternatively, the convex portion 149a may also be made of a conductive material. For example, the surface of the pixel electrode 141 may be formed in a convex shape.

Second Embodiment

Figure 10:
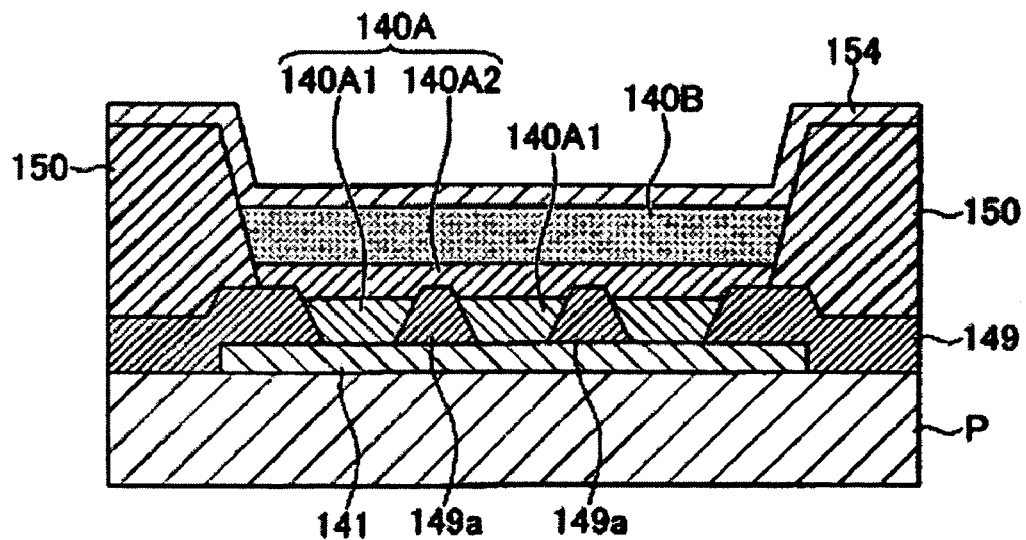
FIG. 10 is a cross sectional view of an organic EL device according to the second embodiment of the present invention.

While a case where the hole injection layer 140A is in a single layer has been described in the first embodiment, the present invention can be also applied to a case where the hole injection layer 140A has a multiple-layered structure having more than two layers. FIG. 10 is a partial cross-sectional view of an organic EL device when a two-layered hole injection layer 140A is formed, which corresponds to FIG. 3(a).

As shown in FIG. 10, when the hole injection layer 140A comprises a first hole injection layer 140A1 and a second hole injection layer 140A2 deposited thereon, the convex portions 149a arranged on the pixel electrode 141 are formed to have any height less than a height in which the convex portion 149a does not penetrate the second hole injection layer 140A2 serving as the uppermost layer (layer near the light-emitting layer 140B). For example, although the convex portion 149a penetrates the first hole injection layer 140A1 and the top portion thereof is arranged on the second hole injection layer 140A2 in FIG. 10, the convex portion 149a may be arranged in the first hole injection layer 140A1. In a certain case, the hole injection layers 140A1 and 140A2 can be flattened and uniform without degrading charge transport in the light-emitting layer 140B, so that the uniform emission can be obtained and an organic EL element having a high brightness can be formed.

Third Embodiment

Next, an organic EL device according to a third embodiment of the present invention will be described with reference to FIG. 13. FIGS. 13(a) to 13(d) are plan views showing a pixel 71 of the organic EL device according to the third embodiment, which are corresponding to FIG. 2(b).

While the convex portion 149a arranged on the pixel electrode 141 is formed in a stripe type in a plan view in the first embodiment, according to the organic EL device of the third embodiment, a plurality of substantially dotted protrusions (convex portion) 149c is formed on the pixel electrode 141, as shown in FIG. 13. Moreover, a difference between the organic EL device of the third embodiment and the organic EL device 70 of the first embodiment is only an arrangement of the convex portion, and others are common.

A shape of the protrusion 149c is not specifically limited, but may be various types such as a circular cylinder, a polygonal cylinder, a circular cone, a polygonal cone, a slightly higher and flat circular cone, and a slightly higher and flat polygonal cone. In addition, it may not be in a symmetric shape in plan view or side view.

Figure 13A:
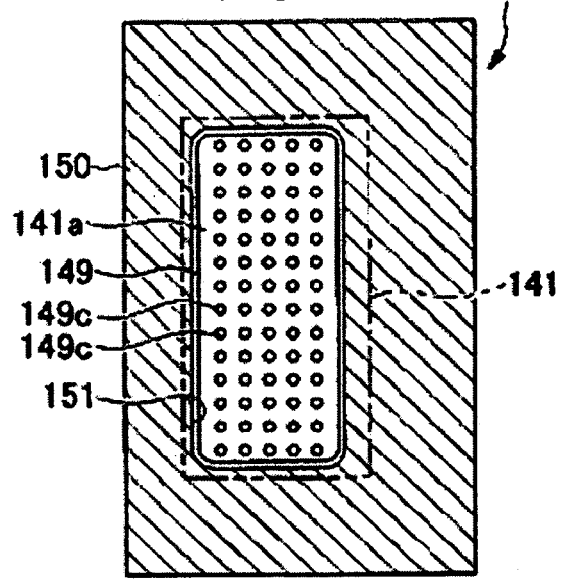
FIGS. 13A-13D are plan views showing an organic EL device according to the third embodiment of the present invention.
Figure 13B:
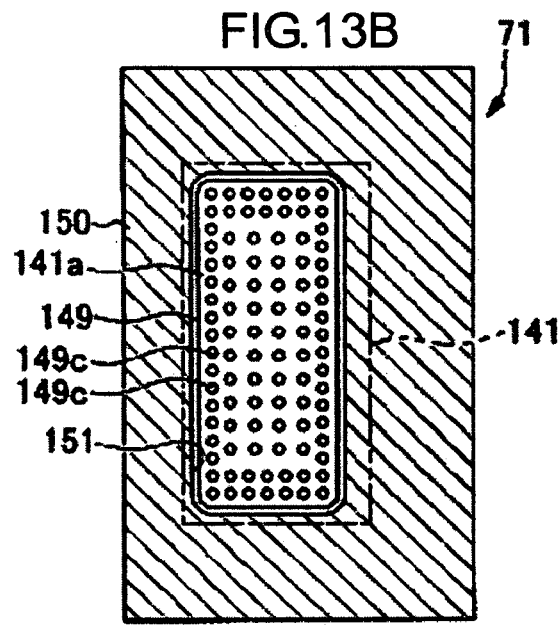
Figure 13C:
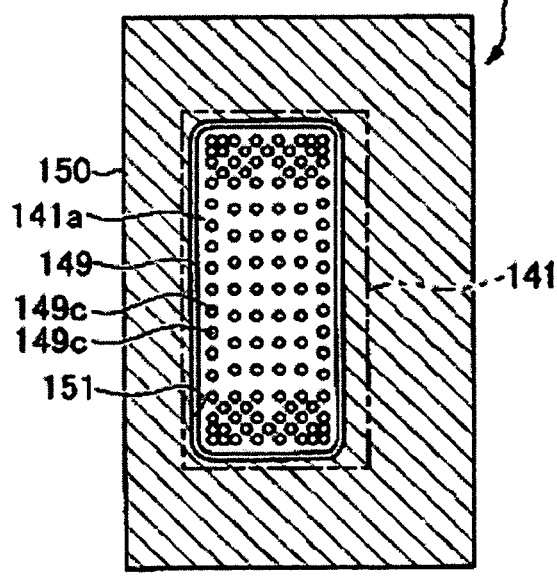
Figure 13D:
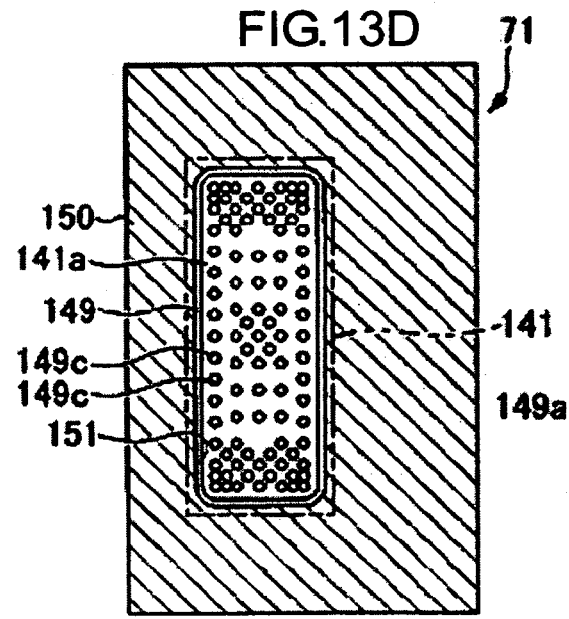

FIG. 13(a) shows a structural example in which the protrusions 149c are arranged at constant intervals on an electrode surface 141a (a surface of the pixel electrode 141 coming in contact with the region surrounded by the bank 150). FIG. 13(b) shows an exemplary arrangement in which the protrusions 149c are arranged in high density (narrow gap) at the circumferential portion of the electrode surface 141a. FIG. 13(c) shows an exemplary arrangement in which the protrusions 149c are arranged in high density at the circumferential portion and the corner portions of the electrode surface 141a. FIG. 13(d) shows an exemplary arrangement in which the protrusions 149c are arranged in high density at the circumferential portion and the corner portions of a substantially rectangular electrode surface 141a in a plan view, as well as at the center of the electrode surface 141a.

With the respective exemplary arrangements shown in FIGS. 13(a) to 13(d), the same effect as the convex portion 149a of the above-mentioned embodiments can also achieved, so that the organic EL device with which a bright display having a uniform, high efficient emission is enabled can be obtained. In particular, with the arrangements shown in FIGS. 13(b) to 13(d), when the hole injection layer 140A is formed through a liquid phase method, the liquid material can be retained in a region where the thickness of film becomes thin, so that a uniform thickness and the hole injection layer 140A having the uniform thickness can be formed. In addition, according to the arrangement shown in FIG. 13(d), when the pixel is formed in an elongated shape, for example, having a ratio of a short side to a long side of 1:2 or more, the protrusions 149c arranged in high density at the center can prevent liquid material from being spread over the circumferential portion of the electrode surface 141a for the center thereof to become thin.

Furthermore, while the plane dimension or protrusion height of the protrusion 149c may be adjusted to proper size or height in response to a size of the pixel (plane region surrounded by the bank 150), resistance of the hole injection layer increases with the small region in which the surface of the pixel electrode 141 is covered by the protrusion 149, so that the luminance is easily degraded. In order to suppress the degradation of the luminance while improving uniformity of the thickness of the organic functional layer and improving the emission efficiency, a total area of the protrusions 149c is preferably about 10% or less with regard to the area of the pixel electrode 141. In addition, even when the convex portion 149 is formed in a stripe shape in a plan view as shown in FIG. 2, the same region ratio is preferably provided.

(Fabrication Method of Organic EL Device)

A method of manufacturing an organic EL device according to the present invention will now be described with reference to the accompanying drawings. In the present embodiment, a method of manufacturing the organic EL device arranged as shown in FIGS. 1 to 3 using a liquid droplet ejection method (inkjet method) will be described.

<Liquid Droplet Ejection Device>

Figure 4:
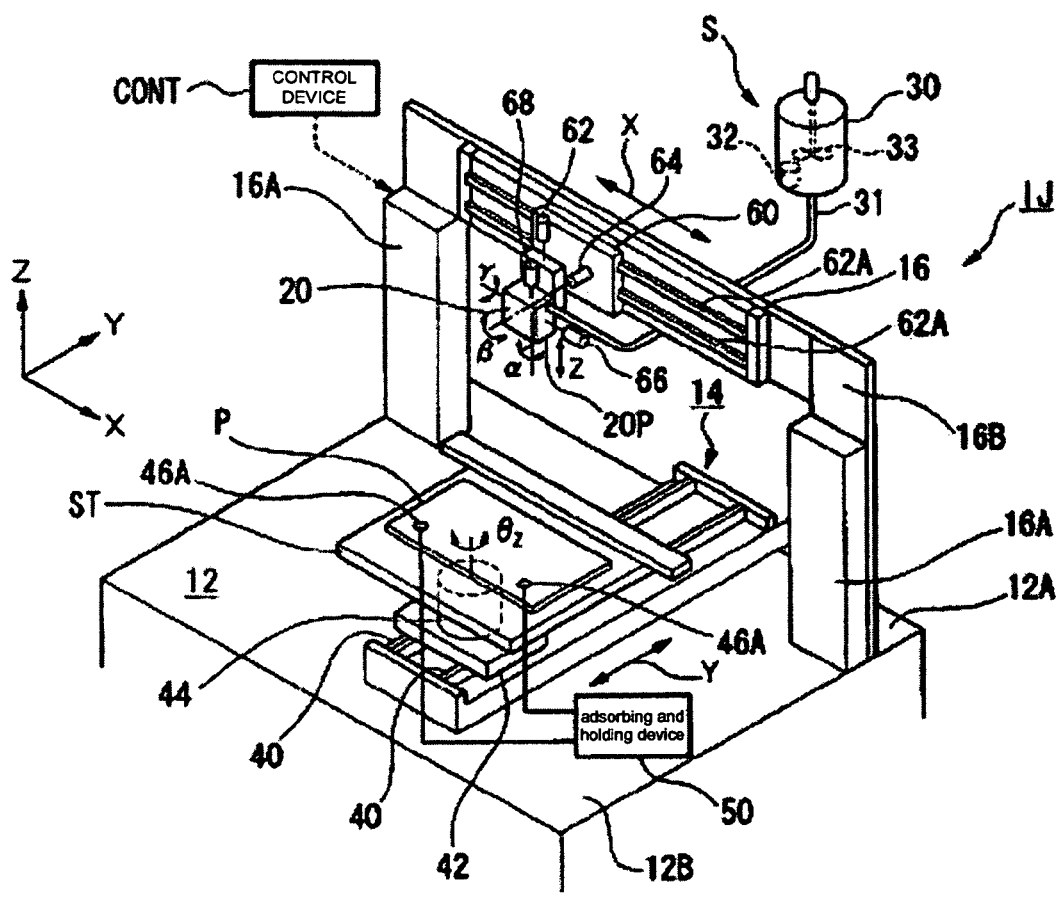
FIG. 4 is a perspective view of a liquid droplet ejection head.
Figure 5:
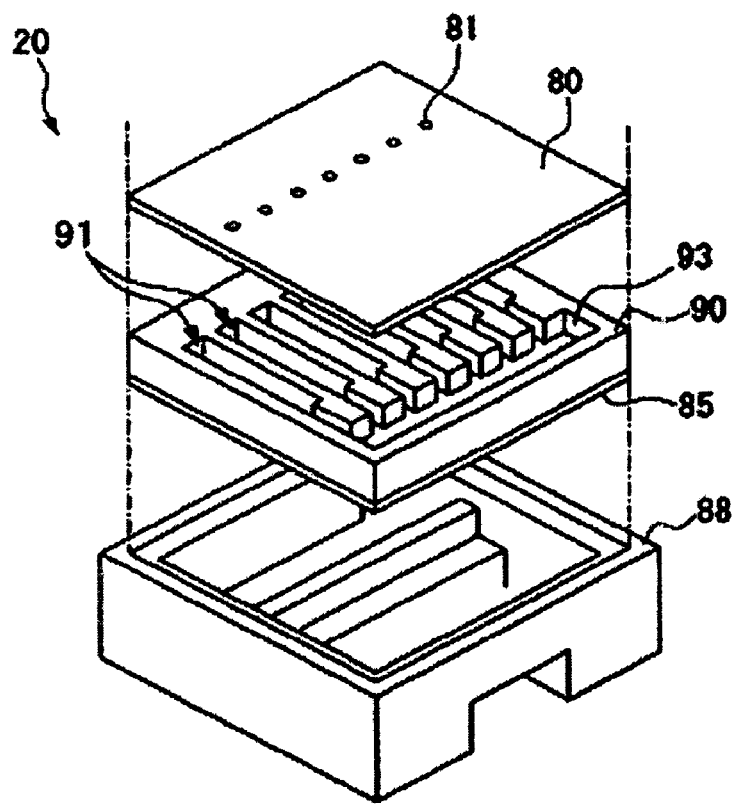
FIG. 5 is a diagram for explaining a liquid droplet ejection head.
Figure 6:
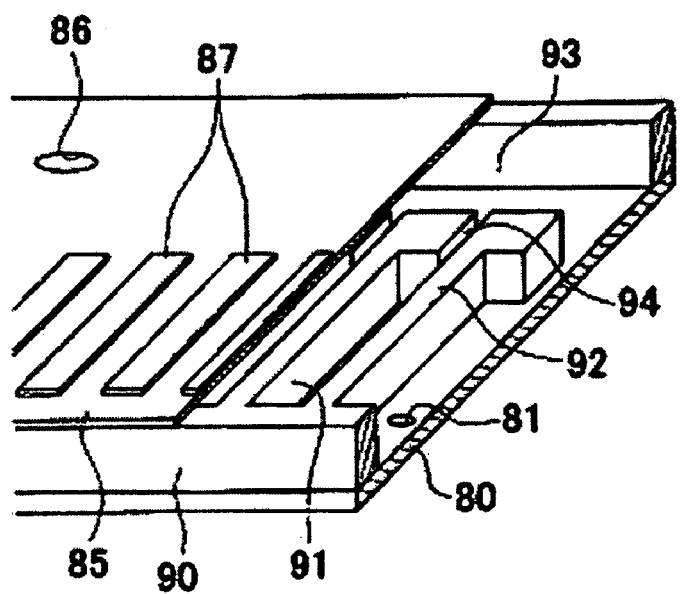
FIG. 6 is a diagram for explaining a liquid droplet ejection head.

First, prior to explaining the fabrication method, a liquid droplet ejection device that can be appropriately used to fabricate an organic EL device will be described. FIG. 4 is a schematic perspective view of a liquid droplet ejection device used for manufacturing an organic EL device of the present invention. In addition, FIGS. 5 and 6 are diagrams showing a liquid droplet ejection head arranged on the liquid droplet ejection device.

In FIG. 4, a liquid droplet ejection device IJ is a film formation device in which a liquid droplet (ink droplet) can be placed on a surface (predetermined plane) of a substrate P, comprising a base 12; a stage (stage device) ST arranged on the base 12 to support the substrate P; a first moving device 14 interposed between the base 12 and the stage ST to movably support the stage ST; a liquid droplet ejection head 20 for quantitatively ejecting (dropping) the liquid droplet that contains material for forming an organic functional layer, on the substrate P supported by the stage ST; and a second moving device 16 for movably supporting the liquid droplet ejection head 20. Operation of the liquid droplet ejection device IJ such as liquid droplet ejection operation by the liquid droplet ejection head 20 and the movement operation by the first and second moving devices 14 and 16 is controlled using a control device CONT.

The first moving device 14 is arranged on the base 12, and is located along the Y-axis direction. The second moving device 16 is supported on the upper side of the first moving device 16 by using pillars 16A and 16A standing at a back portion 12A of the base 12. The X-axis direction of the second moving device 16 is perpendicular to the Y-axis direction of the first moving device 14. Here, a Y-axis direction refers to a direction along a front portion 12B and the back portion 12A of the base 12. With regard to this, an X-axis direction refers to a direction along left and right side of the base 12, and these two directions are in the same plane. In addition, a Z-axis direction is a direction perpendicular to X-axis direction and Y-axis direction.

The first moving device 14 comprises two guide rails 40 having a linear motor; and a slider 42 movable along the guide rails 40 and 40. The slider 42 of the linear-motor type first moving device 14 can be located in Y-axis direction along the guide rail 40. The slider 42 has a motor 44 for Z-axis rotation ($\theta Z$). The motor 44 is, for example, a direct drive motor, and a rotor of the motor 44 is fixed to the stage ST. With this, the motor 44 is energized and the rotor and the stage ST are rotated along a $\theta Z$ direction, so that the stage ST can make an index (rotational division). In other words, the first moving device 14 can move the stage ST along the Y-axis direction and $\theta Z$ direction.

The stage ST holds the substrate P to locate at a predetermined position. In addition, the stage ST has an adsorbing and holding device 50, and by operating the adsorbing and holding device 50, the substrate P can be adsorbed and held on the substrate P via an adsorption hole 46A arranged on the stage ST.

The second moving device 16 comprises a column 16B arranged by a linear motor and fixed to pillars 16A and 16A; a guide rail 62A supported by the column 16B; and a slider 60 supported movably in X-axis direction along the guide rail 62A. The slider 60 can be located by moving along the guide rail 62A in X-axis direction. The liquid droplet ejection head 20 is mounted on the slider 60.

The liquid droplet ejection head 20 comprises motors 62, 64, 66, and 68 as a fluctuation-locating device. When the motor 62 is driven, the liquid droplet ejection head 20 can be located upward and downward along Z-axis. The Z-axis is a direction (vertical direction) perpendicular to the X axis and the Y axis, respectively. When the motor 64 is driven, the liquid droplet ejection head 20 can be located by fluctuating along a $\beta$ direction of the Y-axis rotation. When the motor 66 is driven, the liquid droplet ejection head 20 can be located by fluctuating along a $\gamma$ direction of the X-axis rotation. When the motor 68 is driven, the liquid droplet ejection head 20 can be located by fluctuating in a $\alpha$ direction of the Z-axis rotation. In other words, the second moving device 16 can support the liquid droplet ejection head 20 so as to be movable in the X-axis direction and Z-axis direction, and the liquid droplet ejection head 20 so as to be movable in the θX direction, θY direction, and θZ direction.

As such, the liquid droplet ejection head 20 of FIG. 4 can be located by moving straight in the Z-axis direction against the slider 60, and can be located by moving along α, β, and γ, and an ejection plane 20P of the liquid droplet ejection head 20 can be exactly located or is subjected to a control of a pose against the substrate P of the stage ST. In addition, the ejection plane 20P of the liquid droplet ejection head 20 has a plurality of nozzles thereon for ejecting liquid droplet.

FIG. 5 is an exploded perspective view showing a liquid droplet ejection head 20. The liquid droplet ejection head 20 comprises a nozzle plate 80 having a plurality of nozzles 81; a pressure chamber substrate 90 having a vibration plate 85; and a case 88 for inserting and supporting the vibration plate 85 into the nozzle plate 80.

As shown in the partial perspective cross-sectional view of FIG. 6, in the main unit of the liquid droplet ejection head 20, the pressure chamber substrate 90 is interposed between the nozzle plate 80 and the vibration plate 85. The nozzles 81 of the nozzle plate 80 correspond to the pressure chamber (cavity) 91 partitioned in the pressure chamber substrate 90. By etching a single crystal silicon substrate, the pressure chamber substrate 90 has a plurality of cavities 91 so that each cavity acts as a pressure chamber. The cavities 91 are divided by a sidewall 92. Each cavity 91 is connected to a reservoir 93, which is a common flow path, through a feed opening 94. The vibration plate 85 is made of, for example, a thermal oxide film.

A tank opening 86 is provided in the vibration plate 85 such that any liquid droplet can be supplied from a tank 30 shown in FIG. 4 to a pipe (flow path) 31. A piezoelectric element 87 is arranged on the position corresponding to the cavity 91 on the vibration plate 85. The piezoelectric element 87 has a structure in which a piezoelectric ceramic crystal such as a PZT element is interposed between an upper electrode and a lower electrode (not shown). Volume of the piezoelectric element 87 can be changed in response to an ejection signal supplied from a control device CONT.

To eject liquid droplet from the liquid droplet ejection head 20, first, the control device CONT supplies the ejection signal for ejecting the liquid droplet to the liquid droplet ejection head 20. The liquid droplet flows into the cavity 91 of the liquid droplet ejection head 20, so that, in the liquid droplet ejection head 20 to which the ejection signal is supplied, volume of the piezoelectric element 87 is changed due to the voltage applied between the upper electrode and the lower electrode. The volume change of the cavity 91 is obtained by deforming the vibration plate 85. As a result, liquid droplet is ejected from the nozzle hole 81 of the cavity 91. The cavity 91 into which liquid droplet is ejected is supplied with liquid material, which is reduced due to the ejection, from a tank 30 described below.

While the liquid droplet ejection head 20 provided in the liquid droplet ejection device IJ according to the present embodiment cause the volume change of the piezoelectric element to eject liquid droplet, the liquid crystal may be ejected by heating and expanding a liquid material using a heating body.

Referring back to FIG. 4, the liquid material arranged on the substrate P is provided from a liquid material adjusting device S. The liquid material adjusting device S comprises a tank 30 capable of accommodating the liquid material; a temperature adjusting device 32 attached to the tank 30 for adjusting a temperature of the liquid material contained in the tank 30; and a stirring device 33 for stirring the liquid material contained in the tank 30. The temperature adjusting device 32 includes a heater to adjust the liquid material contained in the tank 30 to any temperature. The temperature adjusting device 32 is controlled by a control device CONT and the liquid material contained in the tank 30 is adjusted to a desired viscosity through temperature adjustment of the temperature adjusting device 32.

The tank 30 is connected to the liquid droplet ejection head 20 through the pipe (flow path) 31, and the liquid droplet of the liquid material ejected from the liquid droplet ejection head 20 is supplied from the tank 30 through the pipe 31. In addition, the liquid material flowing the pipe 31 is controlled to a predetermined temperature using the pipe temperature adjusting device (not shown) to control viscosity. Moreover, the temperature of the liquid droplet ejected from the liquid droplet ejection head 20 is controlled by a temperature adjusting device (not shown) arranged in the liquid droplet ejection head 20 so that the desired viscosity can be adjusted.

Although one liquid droplet ejection head 20 and one liquid material adjusting device S are respectively shown in FIG. 4, the liquid droplet ejection device IJ has a plurality of liquid droplet ejection heads 20 and liquid material adjusting devices S so that liquid droplets having the same or different liquid material are ejected from the plurality of liquid droplet ejection heads 20, respectively. In addition, the first liquid material is dropped to the substrate P from the first liquid droplet ejection head among the plurality of liquid droplet ejection heads 20, and then the first liquid material is baked or dried. Next, the second liquid material is dropped to the substrate P from the second liquid droplet ejection head among the plurality of liquid droplet ejection heads 20, and then the second liquid material is baked or dried. Then, the same processing is repeated using the plurality of liquid droplet ejection head. Thus, a plurality of material layers is deposited on the substrate P so that a multi-layer pattern can be formed.

<Fabrication Method of Organic EL Device>

Next, a method of manufacturing an organic EL device (organic electroluminescent device) according to the present invention using the above-mentioned liquid droplet ejection device IJ will be described, but an order and a material composition of the liquid material described below are just illustrative only, and the present invention is not limited thereto.

A method of manufacturing an organic EL element arranged on the organic EL device 70 will be described with reference to FIGS. 7 and 8. Here, in FIGS. 7 and 8, only a single pixel 71 is shown for the sake of simplicity of illustration. In the organic EL device according to the present invention, both an arrangement in which light of the organic EL element emits from the substrate side (bottom emission) and an arrangement in which light of the organic EL element emits from the opposite side of the substrate (top emission) can be employed. However, in the present embodiment, the top emission type organic EL device will be illustrated.

Figure 7A:
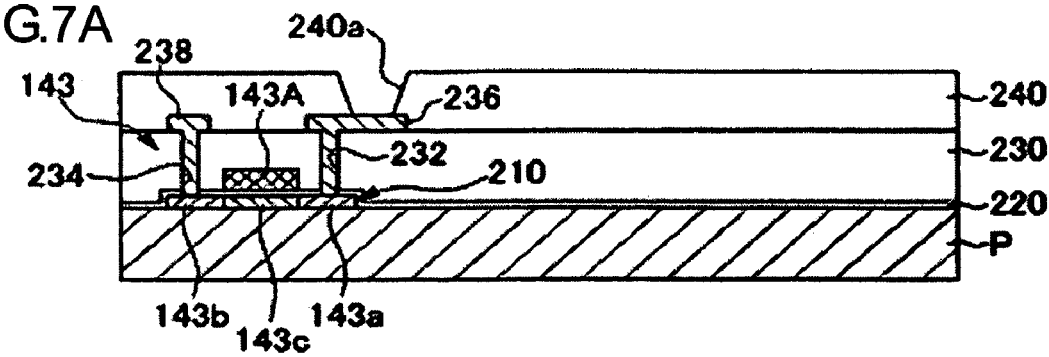
FIGS. 7A-7D are cross sectional views showing a fabrication process of an organic EL device according to an embodiment of the present invention.

First, as shown in FIG. 7(a), a driving TFT 143 is formed on the substrate P. In the top emission type, the substrate may be opaque so that ceramics such as alumina, an insulation processed metal sheet such as a surface oxidized stainless, a thermosetting resin, and a thermoplastic resin may also be used. Further, a glass substrate that has been used for a liquid crystal device can also be employed.

A procedure of manufacturing the driving TFT 143 is as follows, for example.

First, a base protective film (not shown) made of a silicon oxide layer is formed on the substrate P in about 200 to 500 nm through a plasma CVD method using tetraethoxysilane (TEOS) or an oxygen gas. Next, by setting a substrate temperature to about 350° C., an amorphous silicon film is formed on a surface of the substrate P in about 30 to 70 nm through a plasma CVD method, and a semiconductor film 210 is formed by patterning the silicon layer using a well-known photolithography technology. In addition, the semiconductor film 210 is crystallized to form a polysilicon film by performing a crystallization process such as a laser annealing or solid phase growth method. In the laser annealing, a line beam having a long dimension of an excimer laser beam of 400 mm can be used, and output intensity thereof is, for example, 200 mJ/cm$^2$. The line beam is scanned such that portions corresponding to 90% of a peak value of laser intensity for a short dimension direction overlap for respective regions.

Next, a gate insulating film 220 made of a silicon oxide film or a silicon nitride film is formed on the semiconductor film 210 and the substrate P in a thickness of about 60 to 150 nm through a plasma CVD method using TEOS or an oxygen gas as a raw material. In addition, although a channel region and source and drain regions of the driving TFT 143 as shown in FIG. 1 are formed in the semiconductor film 210, other semiconductor film is also provided in which a channel region and source and drain regions of the switching TFT 142 placed at other cross section are formed. In other words, when manufacturing the driving TFT 143 shown in FIG. 7(a), two types of transistors 142 and 143 can be fabricated at the same time.

Next, a conductive film made of a metal film such as aluminum, tantalum, molybdenum, titanium, tungsten, or a combination thereof is formed through a sputtering method and then is patterned to form a gate electrode 143A. Subsequently, source and drain regions 143a and 143b are formed in a self-alignment manner to the gate electrode 143A by implanting a high concentrated phosphorous ion into the semiconductor film 210. At this time, a portion covered by the gate electrode 143, where dopants are not introduced, becomes a channel region 143c. Next, an interlayer dielectric layer 230 covering the surface of the semiconductor film 210 and substrate P is formed.

Next, contacts holes 232 and 234 are formed to penetrate the interlayer dielectric layer 230, and a drain electrode 236 and a source electrode 238 are buried in the contact holes 232 and 234 to form the driving TFT 143. Here, a common power supply line (wiring line) or scanning line (not shown) is provided on the interlayer insulating film 230 to connect the source electrode 238.

Next, to cover the surface of the respective wirings line and interlayer insulating film 230, a planarization insulating film 240 is formed, and a contact hole 240a that penetrates into the planarization insulating film 240 and reaches into the drain electrode 236 is provided.

Figure 7B:
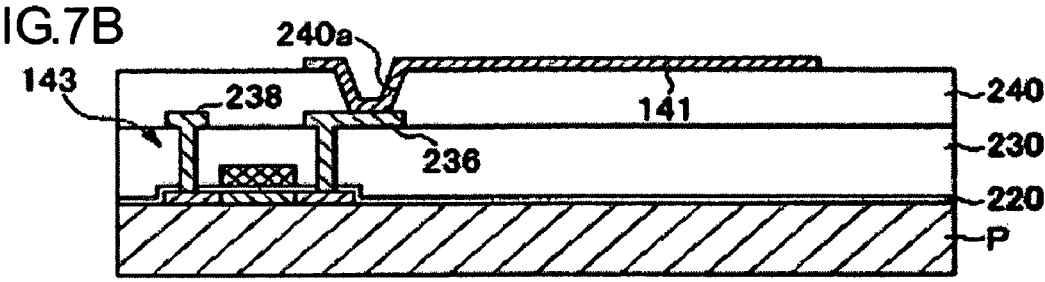

When the driving TFT 143 is formed through the above-mentioned process, next, a pixel electrode 141 is patterned using a well-known photolithography technology at a region including the contact hole 240a, as shown in FIG. 7(b). With this, the pixel electrode 141 electrically connected to the drain region 143a of the driving TFT 143 through the drain electrode 236 is formed at a position surrounded by the signal line, the common power supply line, and the scanning line, as shown in FIG. 2(a).

In the present embodiment, since the organic EL device is a top emission type, the pixel electrode 141 needs not a transparent conductive film, and may be made of a metal material. When the pixel electrode 141 is made of a light reflective metal film such as aluminum and silver, light incident to the pixel electrode 141 is reflected to emit to the observer side. In the organic EL device, the pixel electrode 141 serves as an anode, so that it is preferably made of a material having a work function of 4.8 eV or more, and specifically, preferably made of a metal film made of ITO/Al deposition film, Au and Pt.

Here, before forming the pixel electrode 141, a cleaning process (e.g., oxygen plasma processing, UV illumination processing, and ozone processing) on the surface of the planarization insulating film 240 may be performed. With this, adherence between the pixel electrode 141 and the planarization insulating film 240 can be improved.

Figure 7C:
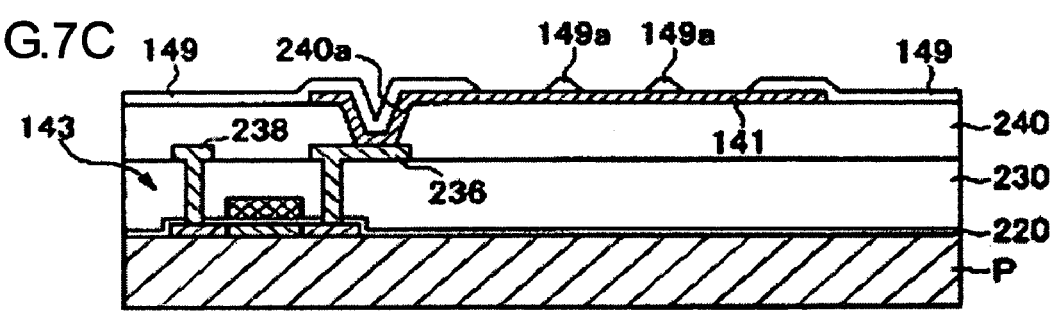

Next, as shown in FIG. 7(c), an inorganic bank (first layer) 149 made of an inorganic insulating material such as silicon oxide is formed to overlap the circumferential portion of the pixel electrode 141 at a part of the area. In addition, at the time, a plurality of convex portions 149 as well as the inorganic bank 149 is formed on the pixel electrode 141. Specifically, a silicon oxide film is formed to cover the pixel electrode 141 and the planarization insulating film 240, and then, the silicon oxide film is patterned using the well-known photolithography technology to partially open the surface of the pixel electrode 141. The convex portions 149a are not limited to the oxide silicon, but may use a metal oxide such as TiO$_2$. In this case, after forming the inorganic bank 149 having an opening on the pixel electrode 141, the TiO$_2$ film, for example, is formed and patterned to form the convex portion 149a.

In FIGS. 7 and 8, to facilitate understanding of the drawings, only two convex portions 149a are illustrated. However, in fact, there are four stripe type convex portions 149a as shown in FIG. 2(b). In addition, although the present embodiment describes a place for forming the stripe type convex portion 149a in a plan view as shown in FIG. 2, in FIG. 7, dotted type protrusions 149c seen from a plane, shown in FIG. 13, in addition to the inorganic bank 149 can be formed on the pixel electrode 141 using the above-mentioned method.

A method of forming the convex portion 149a will now be described in detail with reference to FIG. 14. FIGS. 14(a) to 14(c) are cross-section processing diagrams showing processes for forming the convex portion 149a and the inorganic bank 149 on the pixel electrode 141, which correspond to processes between the process shown in FIG. 7(b) and the process shown in FIG. 7(c) among a series of processes shown in FIG. 7.

Figure 14A:
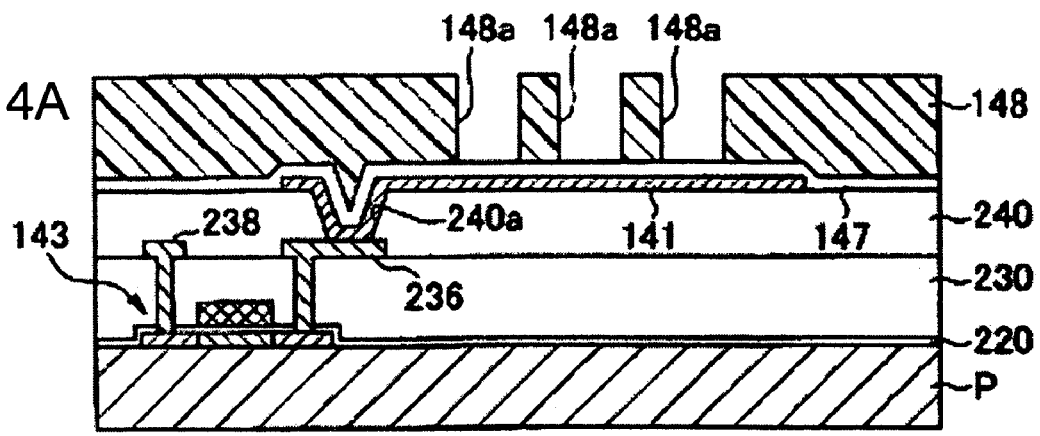
FIGS. 14A-14C are cross sectional views showing a fabrication process of an organic EL device.

To form the inorganic bank 149 and the convex portion 149a, first, as shown in FIG. 14(a), an inorganic insulating film 147 made of a silicon oxide film is formed at a region on the planarization insulating film 240 including the pixel electrode 141. Next, a photoresist 148 is formed to cover the inorganic insulating film 147, and then, exposed and developed to form an opening 148a at a predetermined position on the pixel electrode 141.

Figure 14B:
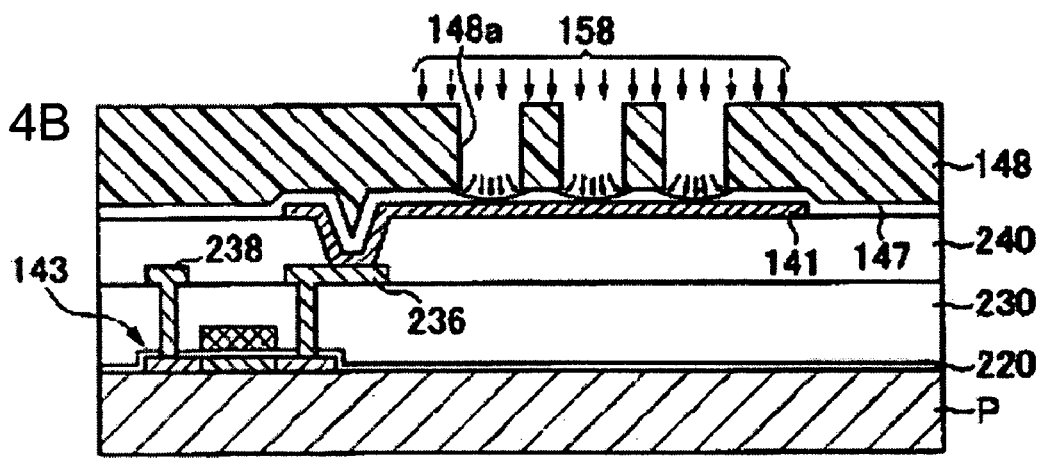
Figure 14C:
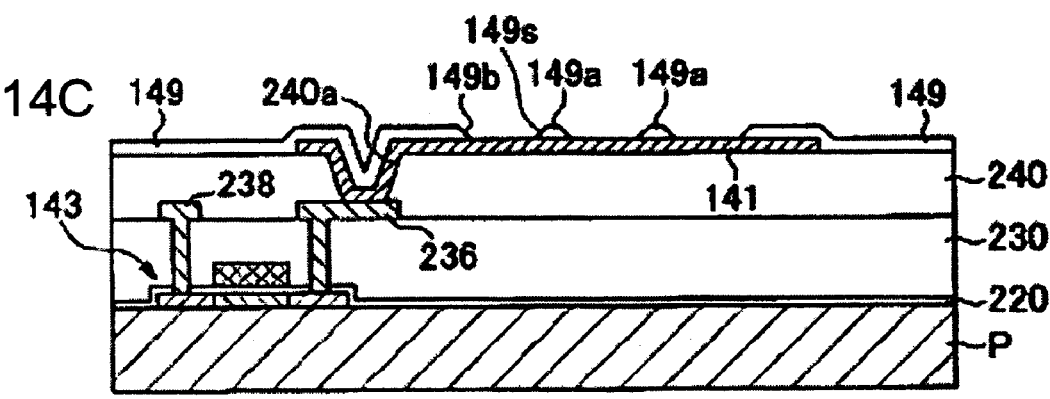

Next, as shown in FIG. 14(b), the inorganic insulating film 147 exposed at the lower portion of the opening 148a is partially removed by an etching process using the photoresist 148 as a mask. Here, in the fabrication method of the present embodiment, isotropic etching means are preferably used as etching means 158. By isotropically etching the inorganic insulating film 147 by the etching means 158, as shown, the convex portion 149a having a tilting plane formed at the sidewall can be formed on the pixel electrode 141. In addition, a tilting portion as in the convex portion 149a is also formed at an edge end of the opening 149b of the inorganic bank 149 formed along with the convex portion 149a.

In addition, with the fabrication method, when the dotted type protrusion 149c shown in FIG. 13 is formed, the protrusion having a narrowed shape in the protrusion direction (a taper type) can be formed. Therefore, between the convex portion 149a having the tilting plane on the sidewall and a tapered protrusion 149c, the step difference of the surface of the pixel electrode 141 is relieved due to the tilting plane, so that the film formation defect of the hole injection layer 140A formed on the pixel electrode 141 during a following process is hardly generated. In addition, while the organic EL device is in operation, the charge injected from the pixel electrode is surrounds the convex portion, so that emission efficiency is improved. Furthermore, among light generated in the light-emitting layer 140B, a component propagating in the direction of the element plane can be easily emitted as a display light.

As the isotropic etching means, the dry etching using anode coupling or a remote plasma as well as the wet etching may be used. The etching may be performed while retreating the photoresist 148 using the etching gas in which the oxygen-containing amount increases (expanding the opening 148a in the surface direction).

Figure 7D:
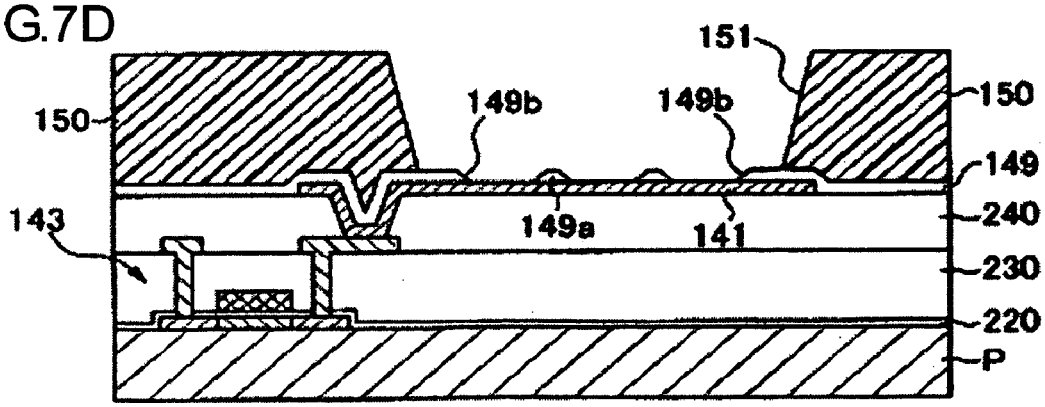

Next, as shown in FIG. 7(d), a bank (second layer) 150 made of an organic insulating material such as acrylic and polyimide is formed on the inorganic bank 149. The height of the bank 150 is set to be about 1 to 2 μm, acting as a partitioning member of the organic EL element on the substrate P. With this construction, an opening 151 having a step difference in a sufficient height is formed at forming places of the hole injection layer and the light-emitting layer of the organic EL element, i.e., between a position on which these forming material is applied and a peripheral bank 150.

In addition, when the bank 150 is formed, it is desirable that the sidewall of the opening 151 of the bank 150 is retreated a bit outside from the opening 149b of the inorganic bank 149. Thus, by partially exposing the inorganic bank 149 in the opening 151 of the bank 150, wettability of the liquid material can be favorably spread in the bank 150.

After forming the bank 150, a lyophobic treatment is performed corresponding to a region of the substrate including the bank 150 and the pixel electrode 141. Since the bank 150 acts as a partitioning member that partitions the organic EL element, it is desirable that a non-affinity (liquid-repellent) is shown with respect to the liquid material ejected from the liquid droplet ejection head 20, and through the liquid-repellent processing, the non-affinity can be selectively provided to the bank 150.

With the liquid-repellent processing, for example, by using a method that performs a surface processing on the surface of the bank with a fluorine-based compound can be employed. As a fluorine compound, there are CF$_4$, SF$_6$, and CHF$_3$, for example. In addition, as a surface processing, there can be a plasma processing and a UV illumination processing.

In the liquid-repellent processing, the processing is performed all over the substrate, and a surface of the pixel electrode 141 made of the inorganic material having an ITO film and a metal film becomes more repellent than the surface of the bank 150 made of the organic material. In addition, the surface of the bank 150 becomes selectively liquid-repellent so that a number of regions having different affinities to the liquid-repellent material are formed in the region surrounded by the bank 150. In addition, while the convex portions 149a are arranged on the pixel electrode 141 according to the present embodiment, the convex portion 149a may be made of, for example, silicon oxide, which is more difficult to be liquid-repellent than for the ITO film and the metal film. Therefore, with regard to the liquid-repellent characteristics, the bank 150 is the largest, and the liquid-repellence becomes smaller in the order of the pixel electrode 141 and the convex portion 149a (and inorganic bank 149).

Figure 8A:
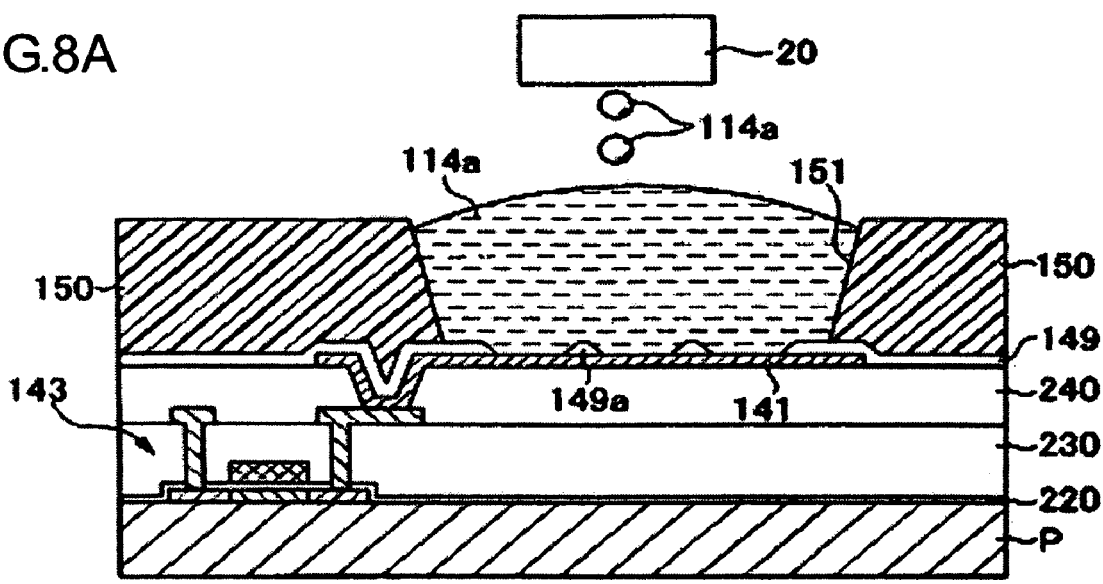
FIGS. 8A-8C are cross sectional views showing a fabrication process of an organic EL device according to an embodiment of the present invention.

Next, as shown in FIG. 8(a), with the upper surface of the substrate P facing upward, the liquid material 114a containing the hole injection layer forming material is selectively deposited at a deposition position by surrounding liquid material 114a into the bank 150 using the liquid droplet ejection head 20. The liquid material 114a for forming the hole injection layer is prepared by the liquid material adjusting device S shown in FIG. 4, and it contains a hole injection layer forming material and solvent.

The forming material of the hole injection layer may be polyphenylenevinylene that a polymer precursor is polytetrahydrothiophenylphenylene, 1,1-bis-(4-N,N-ditolylaminophenyl)cyclohexane, tris(8-hydroxyquinolinol)aluminum, polystyrenesulfonate, and a compound of polyethylenedioxythiophene and polystyrenesulfonate (PEDOT/PSS). In addition, a solvent may be a polar solvent such as an isopropylalcohol, N-methylpyrrolidone, and 1,3-dimethylimidazolinone.

When the liquid material 114a containing the above-mentioned hole injection layer forming material is ejected on the substrate P by the liquid droplet ejection head 20, and it spreads in the plane direction due to high fluidity. However, since the bank 150 surrounding the applied position is provided, the liquid material 114a is prevented from spreading outward over the bank 150. In addition, according to the present invention, the surface of the pixel electrode 141 becomes lyophilic so that a surface of the convex portion 149a formed on the surface of the pixel electrode 141 has a higher affinity to the liquid material than that of the pixel electrode 141. Accordingly, the liquid droplet material 114a applied on the pixel electrode 141 is uniformly spread without void in the bank 150 on the pixel electrode 141 along the convex portion 149a. In particular, when the convex portion 149a is made of TiO$_2$ and the aqueous solvent is used in the liquid material 114a, a significantly favorable affinity between the convex portion 149a and the liquid material 114a is expressed, so that the hole injection layer 140A can be uniform.

Figure 8B:
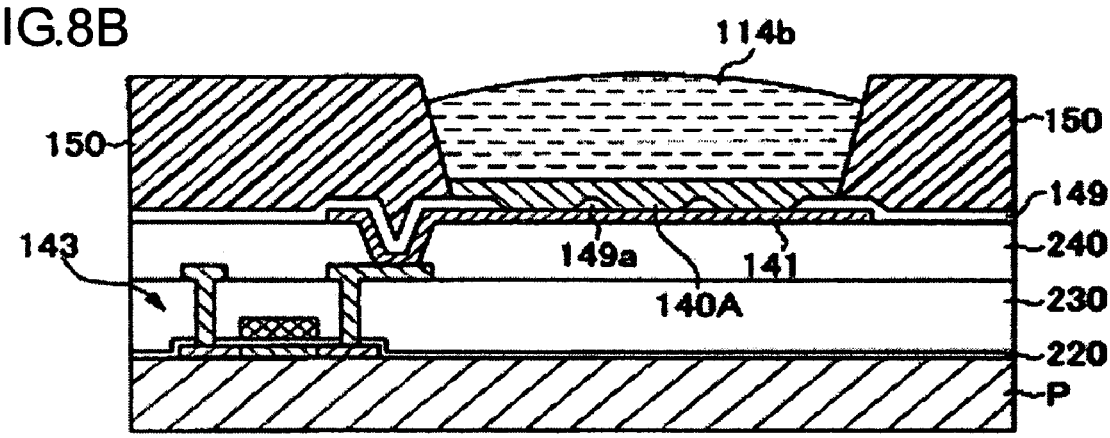
Figure 8C:
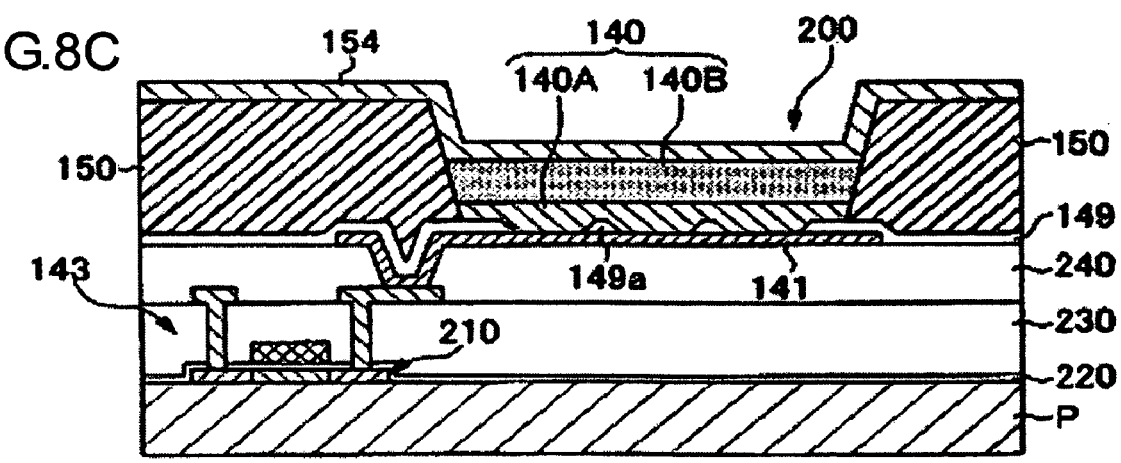

In addition, an ejection amount provided by covering the convex portion 149 with the hole injection layer 140B (see FIG. 8(c)) obtained by drying and solidifying the liquid material 114a is adjusted to be supplied into the bank 150.

Next, as shown in FIG. 8(c), the solvent in the liquid material 114a is evaporated by heating and light illumination to form a solid phase hole injection layer 140A on the pixel electrode 141. In addition, under an air environment, or a nitride gas atmosphere, the liquid material 114a may be backed at a predetermined temperature and time (200° C., 10 min). The solvent is removed preferably by arranging the liquid material under the environment lower than the atmospheric pressure (under the pressure-lowering environment). In this case, during a process to arrange the liquid material shown in FIG. 8(b), the liquid material is uniformly wet and spread in the bank 150. Therefore, as shown in FIG. 8(c), the hole injection layer 140A having the flat film shape with a uniform film thickness can be formed.

Figure 9:
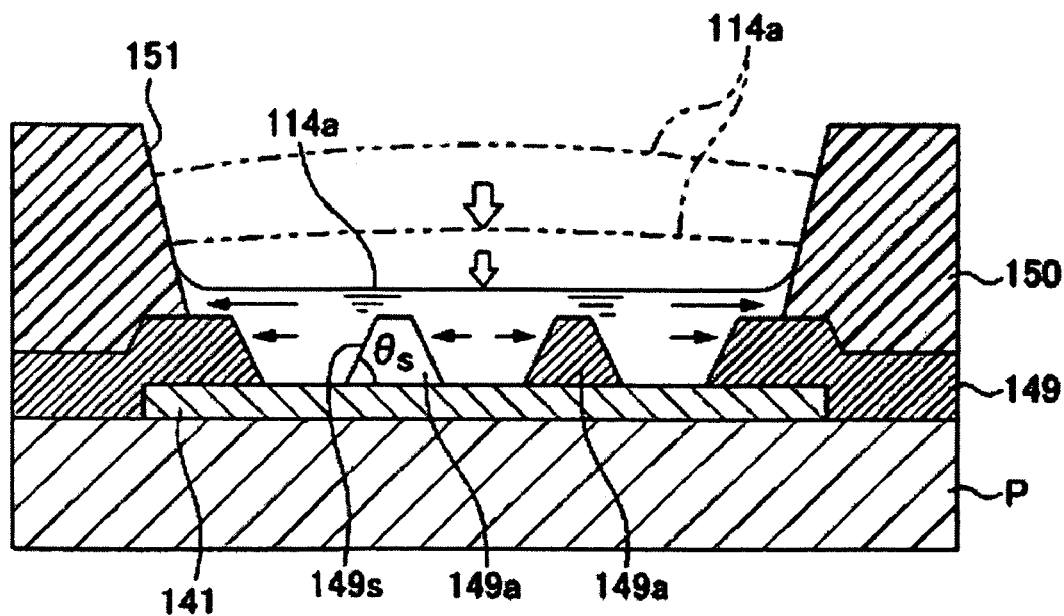
FIG. 9 is a diagram for explaining operation of fabrication of an organic EL device.

In other words, according to the present embodiment, even at the time of drying the liquid material 114a, the film thickness and film quality of the hole injection layer 140A to be formed can be uniform due to the convex portion 149a. FIG. 9 is a partial cross-sectional view for illustrating operation of the convex portion 149a, which corresponds to FIG. 3(a).

For the liquid material 114a dropped from the liquid droplet ejection head 20, a liquid surface is gradually lowered and finally solidified as shown in FIG. 9 at a drying process after deposition so that the hole injection layer 140A is formed. At this time, at the initial drying process, the convex shaped liquid surface is formed in the opening 151 of the bank 150, but as the amount of liquid becomes lesser, the liquid material is pulled and gathered around the inner wall of the bank 150 so that a concave shaped liquid surface can be provided. The surface of the bank 150 is subjected to the liquid-repellent process and the liquid surface is pulled by the surface tension. However, the inside of the liquid material 114a as well as the liquid surface flows toward the bank 150 and the solute (hole injection layer forming material) moves toward the bank 150. Here, when the convex portion 149a is not arranged, the liquid material 114a is unevenly distributed to the circumferential portion of the pixel electrode 141, the thickness of the circumferential side film of the acquired hole injection layer 140A grows large. However, when the convex portion 149a is arranged, since the convex portion 149a serves to block flowing of the liquid material 114a, as shown above, the uneven distribution of the liquid material 114a over the pixel electrode 141a can be effectively prevented so that the acquired hole injection layer 140A also has uniform film thickness and film quality, and a surface having excellent flatness.

In addition, when the protrusion 149c is arranged on the pixel electrode 141 as shown in FIG. 13(a), the uneven distribution of the liquid material over the entire surface of the pixel electrode 141 can be prevented. In addition, when the protrusion 149c is arranged as shown in FIG. 13(b), the liquid material ejected in the bank 150 can be prevented from being a spherical shape due to the surface tension, and accordingly, the small thickness of the circumferential portion of the electrode surface 141a can be prevented. In addition, when the protrusion 149c is arranged as shown in FIG. 13(c), the liquid material can be prevented from spreading apart from corner portions of the electrode surface 141a due to a spherical deformation of the liquid material, so that the hole injection layer 140A can be uniformly formed at the corner portion. In addition, when the protrusion 149c is arranged as shown in FIG. 13(d), the liquid material can be prevented from being unevenly distributed at the cross section in the longitudinal direction of the electrode surface 141a due to the protrusion 149c arranged at the center of the elongated electrode surface 141a, so that the hole injection layer 140A having a uniform thickness can be formed.

Next, as shown in FIG. 8(b), the liquid material 114b containing a light-emitting layer forming material and solvent is selectively deposited on the hole injection layer 140A of the bank 150 by using the liquid droplet ejection head 20 with the upper surface of the substrate P facing upward.

The light-emitting forming material may be a precursor of a conjugated polymer organic compound containing fluorescent pigments to change the light-emitting characteristics of the light-emitting layer. The precursor of the conjugated polymer organic compound having a thin film ejected from the liquid droplet ejection head 20 in addition to the fluorescent pigments is formed, and then, as shown in the following Formula 1, the light-emitting layer forming the conjugated polymer organic EL layer can be formed by heating and hardening. Alternatively, in the case that the precursor is sulfonium salt, there may be a conjugated polymer organic compound in which a sulfonium of the precursor is eliminated by a heating process.

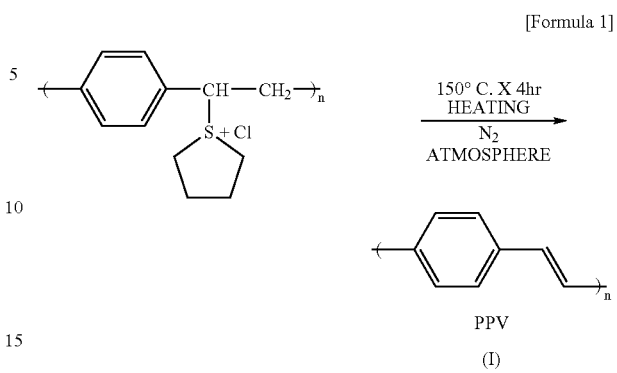

[Formula 1]

The conjugated polymer organic compound has a solid and strong fluorescence, so that a uniform solid ultra-thin film can be fabricated. Moreover, with a various forming ability, adherence to the ITO electrode is high. Furthermore, since the above-mentioned compound precursor forms a solid conjugated polymer film after curing, the precursor solution can be adjusted to a desired viscosity in which a precursor solution can be adapted to the liquid droplet ejection patterning before heating and curing. Therefore, a film can be formed easily and shortly with an optimal condition.

As the precursor, it is desirable to use, for example, the precursor of PPV (poly(p-phenylenevinylene)) or a derivative thereof. The precursor of PPV or the derivative is water-soluble or organic solvent-soluble, and since it can be polymerized, a high quality thin film can be optically obtained. Furthermore, the PPV has a strong fluorescence, and it is also a conductive polymer where π electrons in a double coupling are not polarized on the polymer chain, so that a high performance organic EL element can be obtained.

As a precursor of the PPV or the PPV derivative, as shown in Formula (II), there can be provided, for example, phosphorus, a PPV (poly(paraphenylenevinylene)) precursor, an MO-PPV (poly(2,5-diemthoxy-1,4-phenylenevinylene)) precursor, a CN-PPV (poly(2,5-vis hexyloxy-1,4-phenylene-(1-cyanovinylene))) precursor, and a MEH-PPV (poly[2-methoxy-5-(2'-ethylhexyloxy)]-paraphenylenevinylene) precursor.

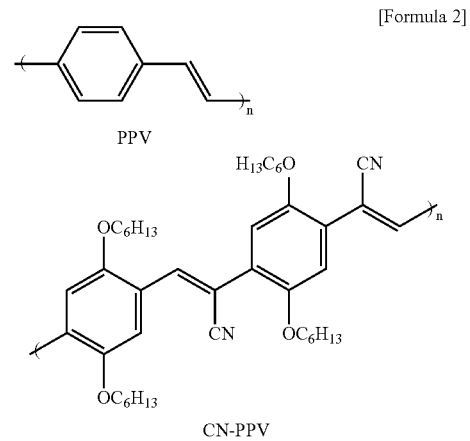

[Formula 2]

-continued

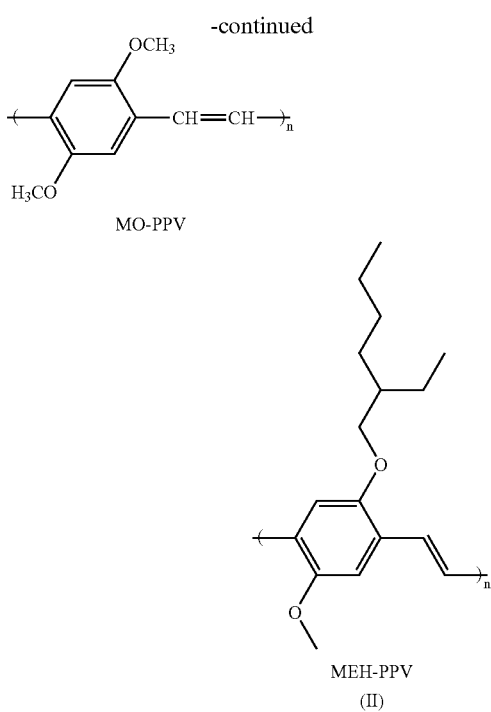

MO-PPV

MEH-PPV
(II)

The precursor of PPV or the PPV derivative is water-soluble, and is polymerized by heating after film formation to form the PPV layer. A content of the precursor represented by the PPV precursor is preferably 0.01 to 10.0 percent by weight to the overall liquid material composition, and more preferably 0.1 to 5.0 percent by weight. When the addition of the precursor is too small, it is not sufficient to form the conjugated polymer layer. When the addition of the precursor is too large, the viscosity of the liquid material composition increases and a high definition patterning using a liquid droplet ejection (inkjet method) may not be appropriated.

Furthermore, as light-emitting forming material, at least one type of fluorescent pigment may be used. With this, the emission characteristic of the emission layer can be changed, and means for improving emission efficiency of the light-emitting layer or converting a light absorption maximum wavelength (emission color) can also be used. In other words, the fluorescent pigment is not used merely as light-emitting layer material, but as pigment material serving the emission function itself. For example, an exciton generated by a carrier recombination of the conjugated polymer organic compound molecule can be substantially transferred to the fluorescent pigment molecule. In this case, since emission is generated from a fluorescent pigment molecule having the high fluorescent quantum efficiency, current quantum efficiency in the light emission layer is also increased. Therefore, since the emission spectrum of the light-emitting layer falls in to the fluorescent molecule by adding the fluorescent pigment into the forming material of the emission layer, means for changing emission color can be available.

In addition, the term 'current quantum efficiency' refers to a measure of emission performance based on the emission function, which is defined by the following equation.

$\eta E$=emitted photon energy/input electric energy

In addition, with a change of the light absorption maximum wavelength due to a doped fluorescent pigment, three raw colors such as red, green, and blue can be emitted, for example. As a result, a full color display body can be implemented. By doping the fluorescent pigment, the emission efficiency of the EL device can be significantly improved.

As the fluorescent pigment, in case of the red emission layer, rhodamine or rhodamine derivate is preferably used. The fluorescent pigment is a low molecular, so that it is water-soluble. In addition, it has a good PPV compatibility and easily forms a uniform and stable emission layer. Specifically, rhodamine B, rhodamine B base, rhodamine 6G, rhodamine 101 perchlorate, and a combination thereof can also be used.

In addition, in case of the green emission layer, quinacridone and the derivative thereof emitting a green light component are preferably used. As in the red fluorescent pigment, the green fluorescent pigment is a low molecular and water-soluble, and in addition, due to the PPV compatibility, the emission layer is easily fabricated.

Moreover, in case of the blue emission layer, distylbiphenyl and the derivative thereof emitting a blue light component are preferably used. As in the red fluorescent pigment, the blue pigment is a low molecular and soluble in a combination of water and alcohol. In addition, due to the PPV compatibility, the emission layer is easily fabricated.

In addition, as another fluorescent pigment that emits a green color component, coumarin and the derivative thereof can be used. As in the red fluorescent pigment, this fluorescent pigment is a low molecule and water-soluble. In addition, due to the PPV compatibility, the emission layer is easily fabricated. Specifically, coumarin, coumarin-1, coumarin-6, coumarin-7, coumarin 12, coumarin 138, coumarin 152, coumarin 153, coumarin 311, coumarin 314, coumarin 334, coumarin 337, and coumarin 343 can be used.

Moreover, as another fluorescent pigment that emits another green emission light component, a tetra phenyl butadiene (TPB) and the TPB derivative can be used. As in the red fluorescent pigment, this fluorescent pigment is a low molecule and water-soluble. In addition, due to the PPV compatibility, the emission layer is easily fabricated.

For the above-mentioned fluorescent pigment, only one type can be used for each color component, or alternatively, more than two types can be combined.

The above-mentioned fluorescent pigment, is preferably added up to 0.5 to 10 percent by weight of the solidified precursor of the conjugated polymer organic compound, and more preferably, is added 1.0 to 5.0 percent by weight thereof. When the addition amount of fluorescent pigment is too large, it is difficult to maintain weather-resistance and durability of the emission layer. In contrast, when the addition amount of the fluorescent pigment is too small, the above-mentioned effect is not sufficiently obtained.

In addition, the precursor and the fluorescent pigment are dissolved and dispersed into polar solvent to use liquid material, and the liquid material is preferably ejected from the liquid droplet ejection head 20. The polar solvent can easily dissolve and uniformly disperse the precursor and the fluorescent pigment, so that a solidified fragment among the emission layer material can be prevented from being attached at the nozzle hole of the liquid droplet ejection head 20, and clogging can also be prevented.

As polar solvent, specifically, there can be used water, alcohol such as methanol and ethanol, compatible to water, and organic solvent and inorganic solvent, such as N,N-dimethylformamide (DMF), N-methylpyrrolidone (NMP), dimethylimidasoline (DMI), dimethylsulxoide (DMSO), xylene, and cyclohexylbenzene, 2,3-dihydrobenzfuran, and a combination thereof.

Furthermore, a moistening agent is preferably added in the forming material. With this, the forming material can be prevented from being dried and solidified at the nozzle holes of the liquid droplet ejection head 20. As the moistening agent, there can be provided, for example, glycerin and polyvalent alcohol such as diethylene glycol, and a combination thereof. As an addition amount of the moistening agent, about 5 to 20 percent by weight can be used for the total amount of forming material.

Other additives and coated layer stabilizing material can be added. For example, stabilizer, viscosity modifier, anti-oxidant, pH modifier, antiseptic agent, resin emulsion, and leveling agent can also be used.

Forming the emission layer by ejecting the liquid material 114b from the liquid droplet ejection head 20 ejects and deposits on the respective corresponding pixel 71 (opening 151) liquid material comprising light-emitting layer forming material that emits a red light component, liquid material comprising light-emitting layer forming material that emits a green light component, and liquid material comprising light-emitting layer forming material that emits a blue light component. Further, the pixels 71 corresponding to the respective colors are predetermined such that these are regularly arranged.

With this method, when the liquid material 114b comprising the light-emitting forming material of the respective colors is ejected and deposited, solvent of the liquid material 114b is evaporated. Through this process, as shown in FIG. 8(c), the solidified light-emitting layer 140B is formed on the hole injection layer 140A, and thus, the organic functional layer 140 having the hole injection layer 140A and the light-emitting layer 140B can be obtained. Here, with respect to evaporation of the solvent of the liquid material 114b using light-emitting forming material, although the processing such as heating or reducing pressure is performed, if needed, the light-emitting layer 140B of the respective color components can be formed by ejecting and depositing the light-emitting layer forming material of the respective color components, one after another, since the light-emitting forming material is a fast drying type, i.e., generally has a favorable drying characteristic. In addition, as described above, the surface of the hole injection layer 140A on which the liquid material 114b is arranged can be favorably flattened, so that the light-emitting layer 140B formed thereon may be formed in a favorable flatness. Accordingly, the layer thickness and layer quality are uniform and the light-emitting layer having a uniform and favorable emission characteristic and reliability.

Next, as shown in FIG. 8(c), the common electrode 154 made of transparent conductive material such as ITO can be formed in a stripe type or all over the surface of the substrate P. By doing this, the organic EL element 200 can be fabricated. The organic EL element 200 according to the present embodiment comprises the pixel electrode 141; the hole injection layer 140A; the light-emitting layer 140B; and the common electrode 154.

With the fabrication method of the organic EL element, the hole injection layer 140A, the light-emitting layer 140B, and a thin film, which is a manufacturing cost factor of the organic EL element, are fabricated using the liquid droplet ejection device IJ, so that loss of liquid material used for the hole injection layer 140A or the light-emitting layer 140B is small, and the hole injection layer 140A or the light-emitting layer 140B are formed at a relatively low costs, and furthermore, stably.

However, as shown in FIG. 8(c), the fabricated driving TFT 143 and the organic EL element 200 are arranged on the vertical direction of the substrate P not to be overlapped with each other. Here, for a so-called top emission structure that emits light from the opposite side of the substrate P, the driving TFT 43 and the organic EL element 200 may be overlapped. In the top emission structure, a thin film transistor need not be arranged below the bank 150, and the forming region of the bank 150 can be small while the forming region of the organic EL element 200 can be large, so that the emission area can be made large.

As described above, according to a fabrication method according to the present invention, while forming a bank 150 and an organic EL element 200 on a substrate P, a convex portion 149a is formed on a pixel electrode 141, and then, liquid material 114a is arranged in the bank 150. Therefore, the surface of the pixel electrode 141 and the liquid material are uniformly spread. In addition, drying and solidification can be performed with a uniform layer thickness. With this, a uniform emission characteristic can be also obtained in a pixel 71. Further, due to the uniform layer thickness, short-circuit hardly occurs so that the organic EL element 200 having an excellent reliability can be fabricated.

In addition, the convex portion 149 can be formed at the same time when an inorganic bank 149 is formed. Therefore, without increasing the number of the processing, characteristic of the organic EL element can be improved. However, it is not necessary that the convex portion 149a and the inorganic bank 149 are formed on the same plane, and they may be formed on the pixel electrode 141 using different processes. In addition, the convex portion 149a may be made of different material that of the inorganic bank 149. Alternatively, the convex portion may be formed by directly processing the surface of the pixel electrode 141.

In the above embodiments, although it has been described that the liquid material is deposited and the organic functional layer 140 is formed with a liquid droplet ejection method using the liquid droplet ejection device IJ, the present invention is not limited to the liquid droplet ejection method, but other deposition methods such as a spin coating, a split coating (or a curtain coating), and a dye coating may be used. In addition, liquid material forming process or film formation process can be performed under an air environment, or inert gas atmosphere such as nitride gas. Moreover, the liquid material forming process using the liquid material adjusting device S or the film formation process using the liquid droplet ejection device IJ is preferably performed in a particle-free and chemically clean room under a clean environment.

(Electronic Apparatus)

Figure 11:
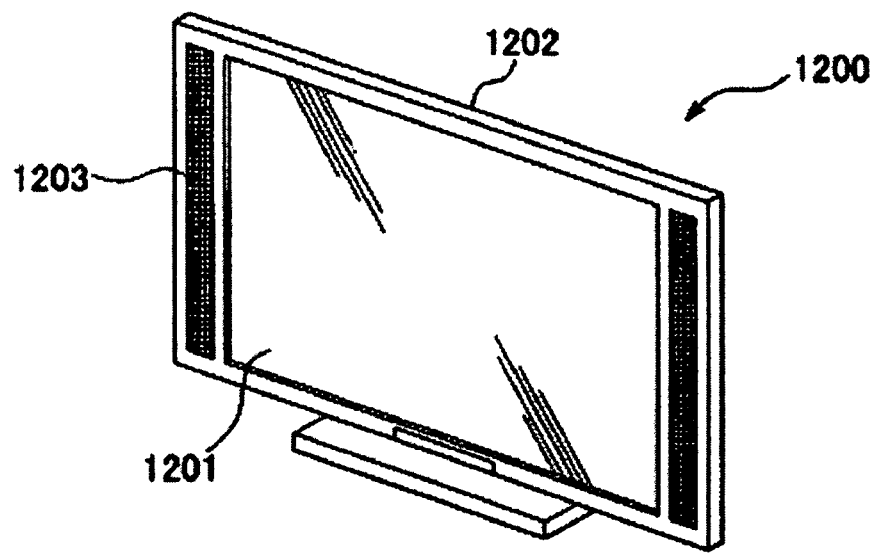
FIG. 11 is a perspective view showing an example of an electronic apparatus.

FIG. 11 is a perspective view showing an example of an electronic apparatus according to the present invention.

An image monitor 1200 shown in FIG. 11 comprises a display unit 1201 having an organic EL display device (display device) according to the above-mentioned embodiment; a case 1202; and a speaker 1203. In addition, the image monitor 1200 can display with a uniform brightness and high image quality. In particular, since the large-size panel has a large-sized pixel, it is difficult to uniform the organic functional layer, or the light-emitting unit, but according to the organic EL device of present invention, the organic functional layer having any size can be uniformly formed. Therefore, it is very suitable for the organic EL device with the large-sized panel.

The exemplary embodiments of the organic EL device is not limited to a mobile phone, but can be also adapted to display means used for an electronic book, a personal computer, a digital camera, a view-finder type or monitor direct-vision type video tape recorder, a car navigation device, a pager, an electronic notebook, a calculator, a word processor, a video call, a POS terminal and a touch panel. Thus, with any electronic apparatus, the high quality display can be provided.

What is claimed is:

1. An organic electroluminescent device comprising:
   a substrate;
   a partition member surrounding regions of the substrate; and
   organic electroluminescent elements arranged above the substrate, each including:
      a first electrode;
      a charge transport layer formed on the first electrode, the charge transport layer being formed in each of the regions of the substrate;
      a convex portion protruding toward the charge transport layer and arranged on the first electrode;
      a light-emitting layer formed above the charge transport layer and the convex portion, the light-emitting layer being formed in each of the regions of the substrate;
      a second electrode formed above the light-emitting layer,
   the partition member being arranged along a periphery of the first electrode,
   a part of the charge transport layer being interposed between the convex portion and the light-emitting layer, and
   the convex portion being formed on the first electrode substantially in a stripe shape in plan view and not in contact with the partition member.

2. The organic electroluminescent device according to claim 1,
   wherein the convex portion extends along a longitudinal direction of the organic electroluminescent element.

3. The organic electroluminescent device according to claim 1,
   wherein the convex portion is made of same material as that of at least a portion of the partition member.

4. The organic electroluminescent device according to claim 3,
   wherein the partition member has a first layer made of an inorganic insulation material and a second layer made of an organic insulating material deposited thereon, and wherein the convex portion is made of the same material as that of the first layer.

5. The organic electroluminescent device according to claim 1,
   wherein the convex portion occupies a part of the first electrode.

6. The organic electroluminescent device according to claim 1, wherein the charge transport layer is one or a plurality of conductive layers, and
   wherein the convex portion is arranged across the respective conductive layers in the thickness direction of the layer.

7. An electronic apparatus having an organic electroluminescent device according to claim 1.

8. An organic electroluminescent device comprising:
   a substrate;
   a partition member surrounding regions of the substrate; and
   organic electroluminescent elements arranged above the substrate, each including:
      a first electrode;
      a charge transport layer formed on the first electrode, the charge transport layer being formed in each of the regions of the substrate;
      a convex portion protruding toward the charge transport layer and arranged on the first electrode;
      a light-emitting layer formed above the charge transport layer and the convex portion, the light-emitting layer being formed in each of the regions of the substrate;
      a second electrode formed above the light-emitting layer,
   the partition member being arranged along a periphery of the first electrode,
   a part of the charge transport layer being interposed between the convex portion and the light-emitting layer, and
   the convex portion being dotted protrusions, the dotted protrusions being formed on the first electrode.

* * * * *